(12) United States Patent
Choi et al.

(10) Patent No.: US 12,526,933 B2
(45) Date of Patent: Jan. 13, 2026

(54) DISPLAY DEVICE WITH IMPROVED IMPACT RESISTANCE

(71) Applicant: Samsung Display Co., Ltd., Yongin-si (KR)

(72) Inventors: Jonghyun Choi, Seoul (KR); Youn Joon Kim, Seoul (KR); Jeoungsub Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 345 days.

(21) Appl. No.: 18/159,567

(22) Filed: Jan. 25, 2023

(65) Prior Publication Data

US 2023/0309248 A1    Sep. 28, 2023

(30) Foreign Application Priority Data

Mar. 28, 2022  (KR) .................. 10-2022-0037947

(51) Int. Cl.
*H10K 59/12*     (2023.01)
*H05K 5/02*      (2006.01)
*H10K 59/121*    (2023.01)

(52) U.S. Cl.
CPC ........... *H05K 5/02* (2013.01); *H10K 59/1213* (2023.02)

(58) Field of Classification Search
CPC .............................. H05K 5/02; H10K 59/1213
USPC ........................................................ 257/91
See application file for complete search history.

(56) References Cited

U.S. PATENT DOCUMENTS

| | | |
|---|---|---|
| 9,881,982 B2 | 1/2018 | Kang et al. |
| 10,074,824 B2 | 9/2018 | Han et al. |
| 10,622,420 B2 | 4/2020 | Choi et al. |
| 11,160,175 B2 | 10/2021 | Park et al. |
| 11,243,564 B2 | 2/2022 | Kim et al. |
| 11,723,238 B2 | 8/2023 | Kim et al. |
| 2019/0073946 A1 | 3/2019 | Su |
| 2019/0278145 A1 | 9/2019 | Tanaka et al. |
| 2020/0212127 A1 | 7/2020 | Choi et al. |
| 2022/0044599 A1 | 2/2022 | La et al. |
| 2022/0050321 A1 | 2/2022 | Park et al. |
| 2022/0069048 A1 | 3/2022 | Bok et al. |

FOREIGN PATENT DOCUMENTS

| | | | | |
|---|---|---|---|---|
| CN | 112863332 A | | 5/2021 | |
| CN | 113257865 A | * | 8/2021 | ........... G06F 1/1641 |
| CN | 114120842 A | * | 3/2022 | ........... G06F 1/1637 |

(Continued)

*Primary Examiner* — Phuc T Dang
(74) *Attorney, Agent, or Firm* — Womble Bond Dickinson (US) LLP

(57) ABSTRACT

A display device includes: a support plate including: a first area; and a second area including a plurality of openings, and a support area adjacent to the plurality of openings; and a display panel including a first display area overlapping with the first area, and a second display area overlapping with the second area. The second display area includes: a first partial area overlapping with at least a portion of the support area, and including a first pixel circuit, a second pixel circuit, and a first light emitting element electrically connected with the first pixel circuit; and a plurality of second partial areas overlapping with the plurality of openings, respectively, and including a second light emitting element electrically connected to the second pixel circuit.

27 Claims, 30 Drawing Sheets

(56) References Cited

FOREIGN PATENT DOCUMENTS

| | | |
|---|---|---|
| KR | 10-2016-0090979 A | 8/2016 |
| KR | 10-2018-0036904 A | 4/2018 |
| KR | 10-2019-0061699 A | 6/2019 |
| KR | 10-2020-0034333 A | 3/2020 |
| KR | 10-2020-0108754 A | 9/2020 |
| KR | 10-2021-0010716 A | 1/2021 |
| KR | 10-2021-0027718 A | 3/2021 |
| KR | 10-2021-0070880 A | 6/2021 |
| KR | 10-2022-0031796 A | 3/2022 |

* cited by examiner

DISPLAY DEVICE WITH IMPROVED IMPACT RESISTANCE

CROSS-REFERENCE TO RELATED APPLICATION

This application claims priority to and the benefit of Korean Patent Application No. 10-2022-0037947, filed on Mar. 28, 2022, the entire content of which is incorporated by reference herein.

BACKGROUND

1. Field

Aspects of embodiments of the present disclosure relate to a display device, and more particularly, to a display device having a shape that changes according to an operation mode.

2. Description of the Related Art

Electronic devices, such as a smartphone, a tablet, a notebook computer, a navigator for a vehicle, and a smart television, are being developed. Such an electronic device is provided with a display device for providing information.

Various types of display devices are being developed in order to satisfy a user UX/UI. From among the display devices, development of a flexible display device is being actively conducted.

The above information disclosed in this Background section is for enhancement of understanding of the background of the present disclosure, and therefore, it may contain information that does not constitute prior art.

SUMMARY

One or more embodiments of the present disclosure are directed to a display device having improved impact resistance characteristics.

According to one or more embodiments of the present disclosure, a display device includes: a support plate including: a first area; and a second area including a plurality of openings, and a support area adjacent to the plurality of openings; and a display panel including a first display area overlapping with the first area, and a second display area overlapping with the second area. The second display area includes: a first partial area overlapping with at least a portion of the support area, and including a first pixel circuit, a second pixel circuit, and a first light emitting element electrically connected with the first pixel circuit; and a plurality of second partial areas overlapping with the plurality of openings, respectively, and including a second light emitting element electrically connected to the second pixel circuit.

In an embodiment, the first area may have a planar support surface.

In an embodiment, the first display area and the second display area may satisfy $W1/Z \geq (W1+W2)/H$. $W1$ may denote a width of the first partial area in a first direction, and $W2$ may denote a width of a second partial area from among the plurality of second partial areas in the first direction; $H$ may denote a standard width of a pixel circuit of the first display area calculated on a basis of a resolution of pixel circuits in the first display area; and $Z$ may denote a standard width of the first pixel circuit calculated on a basis of a resolution of pixel circuits in the first partial area.

In an embodiment, an actual measurement width of pixel circuit of the second display area may be smaller than the standard width of the pixel circuit of the first display area.

In an embodiment, the first display area may include a third pixel circuit, and a third light emitting element electrically connected to the third pixel circuit.

In an embodiment, an area of the third pixel circuit in a plan view may be the same as an area of the first pixel circuit in a plan view and an area of the second pixel circuit in a plan view.

In an embodiment, the first display area may further include a fourth pixel circuit, and at least one of the plurality of second partial areas may further include a fourth light emitting element electrically connected to the fourth pixel circuit.

In an embodiment, the display panel may further include a connection line connecting the fourth pixel circuit and the fourth light emitting element to each other, and the connection line may be located at a different layer from that of an anode of the fourth light emitting element.

In an embodiment, the first display area and the second display area may satisfy $W1/Z < (W1+W2)/H$. $W1$ may denote a width of the first partial area in a first direction, and $W2$ may denote a width of a second partial area from among the plurality of second partial areas in the first direction; $H$ may denote a standard width of a pixel circuit of the first display area calculated on a basis of a resolution of pixel circuits in the first display area; and $Z$ may denote a standard width of the first pixel circuit calculated on a basis of a resolution of pixel circuits in the first partial area.

In an embodiment, a resolution of light emitting elements in the first display area may be the same as a resolution of light emitting elements in the second display area.

In an embodiment, a resolution of pixel circuits in the first partial area of the second display area may be higher than a resolution of pixel circuits in the first display area.

In an embodiment, a resolution of pixel circuits in the first display area may be higher than a resolution of pixel circuits in a second partial area from among the plurality of second partial areas of the second display area.

In an embodiment, a pixel circuit may not be disposed in the second partial area.

In an embodiment, the second partial area may further include a fourth pixel circuit, and a fourth light emitting element connected to the fourth pixel circuit.

In an embodiment, a width of the second partial area may be larger than a width of the first partial area in a first direction.

In an embodiment, each of the second area and the second display area may have a flat shape in a first mode, and each of the second area and the second display area may have a bent shape in a second mode.

In an embodiment, the first area may include a plurality of first areas, and the second area may include a plurality of second areas, and each of the plurality of second areas may be located between two adjacent first areas among the plurality of first areas.

In an embodiment, the display device may further include: a reinforcement member having a lower elastic modulus than that of the support plate, and the reinforcement member may be located inside the plurality of openings.

In an embodiment, the reinforcement member may include any one of silicon, rubber, or a synthetic resin.

In an embodiment, the reinforcement member may include a first reinforcement member having a first elastic modulus, and a second reinforcement member having a second elastic modulus.

In an embodiment, the first reinforcement member and the second reinforcement member may contact an inside of the plurality of openings.

In an embodiment, any one of the first reinforcement member or the second reinforcement member may cover one surface of the support plate.

In an embodiment, the support plate may include a metal.

In an embodiment, the support area of the support plate may include: a plurality of first extension parts arrayed along a first direction, and extending in a second direction that crosses the first direction; and a plurality of second extension parts located between adjacent first extension parts from among the plurality of first extension parts, and extending in the first direction.

In an embodiment, the first extension parts and the second extension parts may define a lattice structure.

In an embodiment, the support area of the support plate may include a plurality of stick members arrayed along a first direction, and extending in a second direction that crosses the first direction, and the plurality of openings may be located between the plurality of stick members.

According to one or more embodiments of the present disclosure, a display device includes: a display area including: a first area; and a second area having a shape that changes according to a change of an operation mode. The second area includes: a first partial area including a first pixel circuit, a first light emitting element electrically connected to the first pixel circuit and overlapping with the first pixel circuit, and a second pixel circuit; and a second partial area including a second light emitting element electrically connected to the second pixel circuit, and not overlapping with the second pixel circuit.

BRIEF DESCRIPTION OF THE DRAWINGS

The above and other aspects and features of the present disclosure will be more clearly understood from the following detailed description of the illustrative, non-limiting embodiments with reference to the accompanying drawings. In the drawings.

DETAILED DESCRIPTION

Figure 1A:
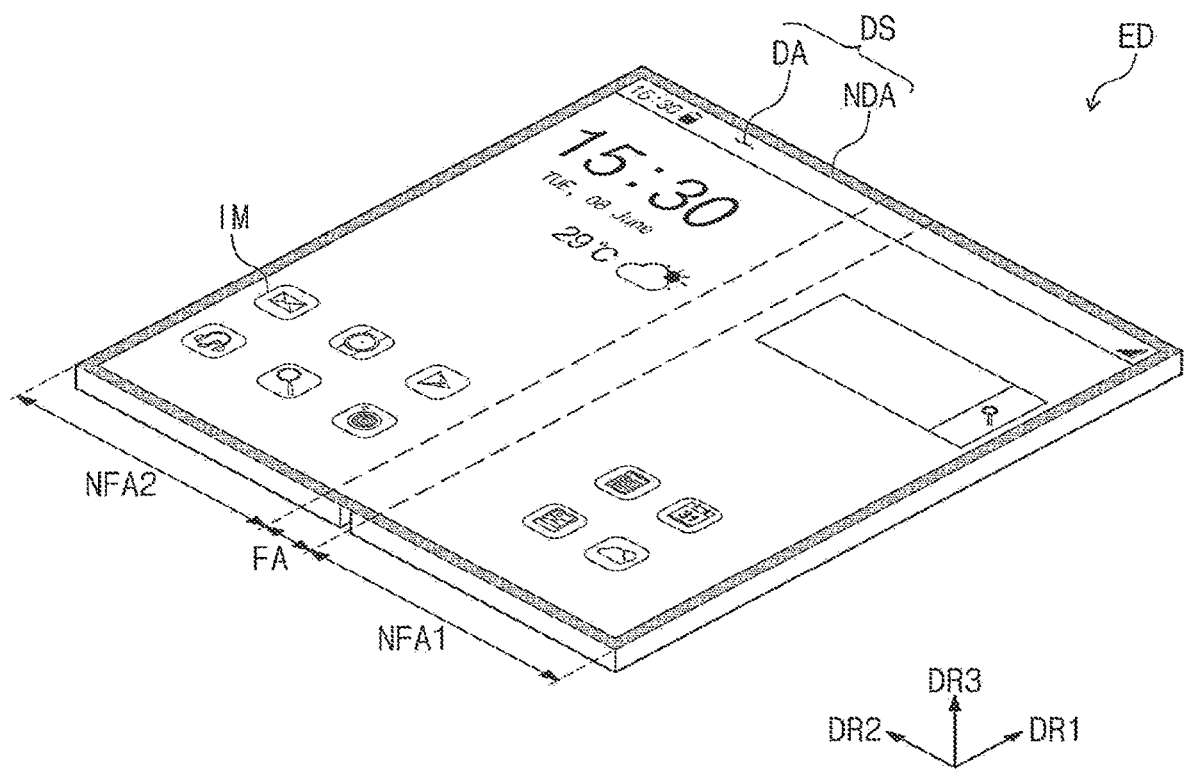
FIGS. 1A-1C are perspective views of an electronic device according to one or more embodiments of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, directions DR1, DR2, and DR3 indicated by the x-axis, the y-axis, and the z-axis are not limited to three axes of the rectangular coordinate system, and may be interpreted in a broader sense. For example, the directions DR1, DR2, and DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
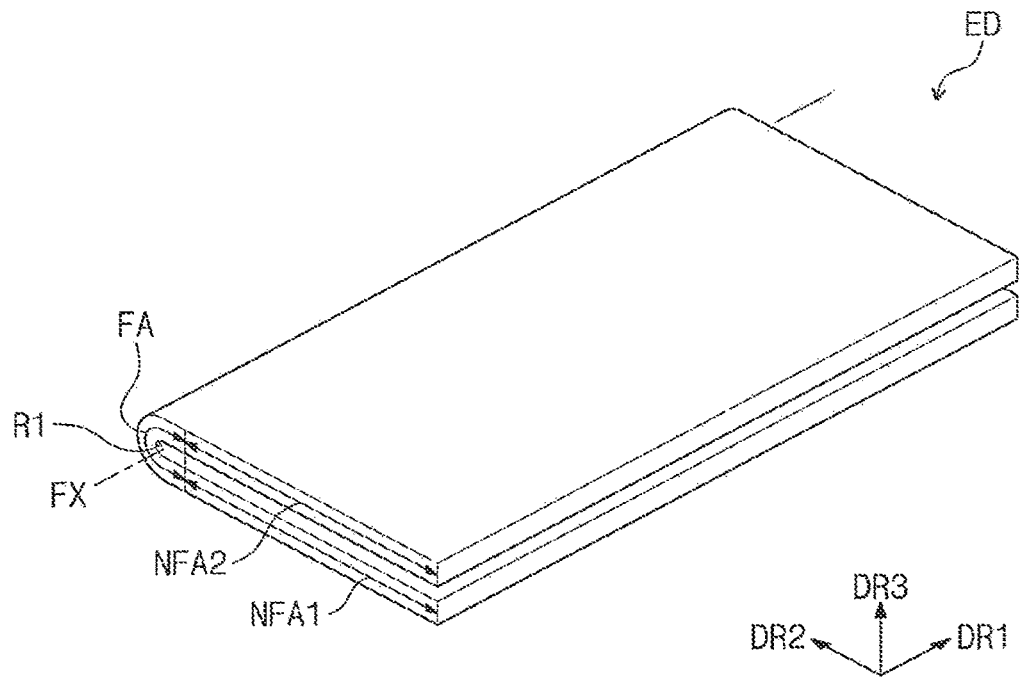
Figure 1C:
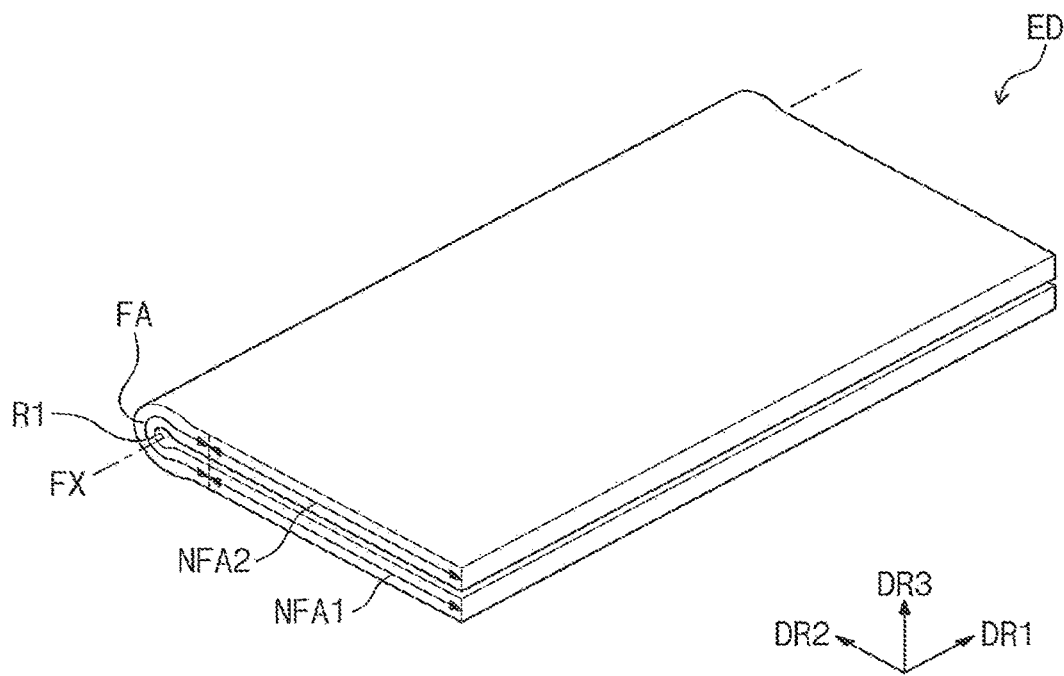

FIGS. 1A to 1C are perspective views of an electronic device ED according to one or more embodiments of the present disclosure. FIG. 1A shows an unfolded state of the electronic device ED, and FIGS. 1B and 1C show a folded state of the electronic device ED.

Referring to FIGS. 1A through 1C, the electronic device ED according to one or more embodiments of the present disclosure may include a display surface DS defined by a first direction DR1, and a second direction DR2 that crosses the first direction DR1. The electronic device ED may provide an image IM to a user through the display surface DS.

The display surface DS may include a display area DA, and a non-display area NDA around (e.g., adjacent to) the display area DA. The display area DA may display the image IM, and the non-display area NDA may not display the image IM. The non-display area NDA may surround (e.g., around a periphery of) the display area DA. However, the present disclosure is not limited thereto, and the shapes of the display area DA and non-display area NDA may be variously modified as needed or desired.

Hereinafter, a direction that vertically or substantially vertically crosses a plane defined by the first and second directions DR1 and DR2 is defined as a third direction DR3. The third direction DR3 corresponds to a reference direction to distinguish a front surface from a rear surface of each member, component, and layer. As used in the present specification, the expression "in a plan view" may refer to a state when viewed in the third direction DR3. Hereinafter, the first to third directions DR1, DR2, and DR3 are indicated by first to third directional axes, respectively, and are referred to with like reference numerals.

The electronic device ED may include a folding area FA, and a plurality of non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2.

The electronic device ED in a first mode may be defined as an unfolded state, and the electronic device ED in a second mode may be defined as a folded state. As the electronic device ED changes from the first mode to the second mode, the shape of the folding area FA changes, but the shapes of the non-folding areas NFA1 and NFA2 do not change.

As shown in FIG. 1B, the folding area FA may be folded on the basis of a folding axis FX that is parallel to or substantially parallel to the first direction DR1. The folding area FA has a suitable curvature (e.g., a prescribed or predetermined curvature), and a radius R1 of the curvature. The first non-folding area NFA1 and the second non-folding area NFA2 may be opposite to each other, and the electronic device ED may be inner-folded, so that the display surface DS is not exposed to the outside.

In an embodiment of the present disclosure, the electronic device ED may be outer-folded, so that the display surface DS is exposed to the outside. In an embodiment of the present disclosure, the electronic device ED may be configured so that an inner-folding operation and/or an outer-folding operation are alternately repeated from an unfolding operation, but the present disclosure is not limited thereto. In an embodiment of the present disclosure, the electronic device ED may be configured to perform any one of the unfolding operation, the inner-folding operation, or the outer-folding operation.

As shown in FIG. 1B, a distance between the first non-folding area NFA1 and the second non-folding area NFA2 may be the same or substantially the same as twice the radius R1 of the curvature, but as shown in FIG. 1C, the distance between the first non-folding area NFA1 and the second non-folding area NFA2 may be smaller than twice the radius R1 of the curvature. FIGS. 1B and 1C are shown on the basis of the display surface DS, and a housing HM (e.g., see FIG. 2) forming an appearance of the electronic device ED may contact terminal areas of the first non-folding area NFA1 and the second non-folding area NFA2.

Figure 2:
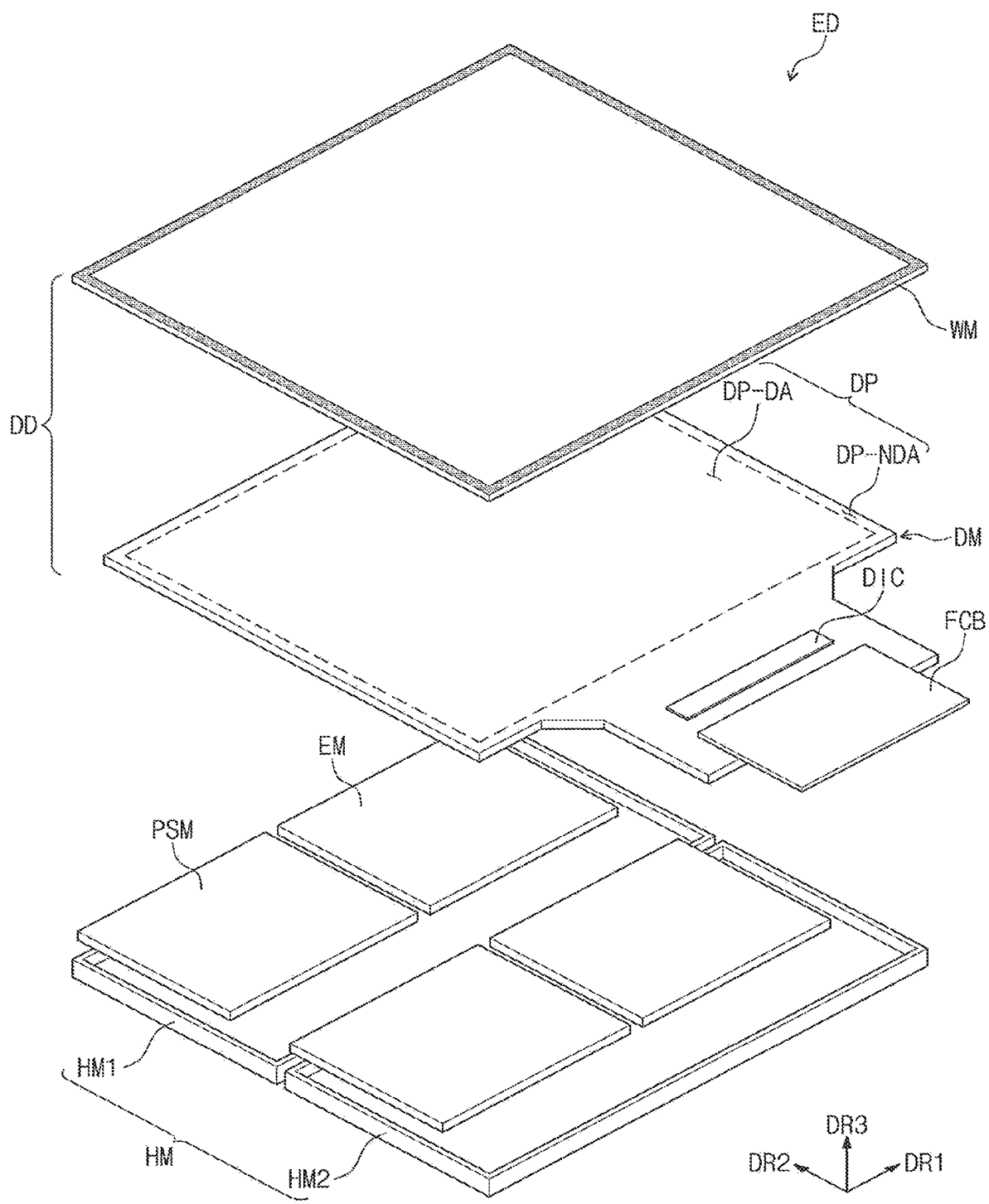
FIG. 2 is an exploded perspective view of an electronic device according to an embodiment of the present disclosure.

FIG. 2 is an exploded perspective view of the electronic device ED according to an embodiment of the present disclosure.

As shown in FIG. 2, the electronic device ED may include a display device DD, an electronic module (e.g., an electronic device or board) EM, a power supply module (e.g., a power supply) PSM, and the housing HM. Although not shown separately, the electronic device ED may further include a mechanism structure (e.g., a hinge) for controlling the folding operation of the display device DD.

The display device DD generates an image, and detects an external input. The display device DD includes a window WM and a display module (e.g., a display or a touch-display) DM. The window WM provides the front surface of the electronic device ED.

The display module DM may include at least a display panel DP. For convenience of illustration, FIG. 2 illustrates only the display panel DP from among various laminated structures of the display module DM, but the display module DM may further include a plurality of components disposed at (e.g., in or on) an upper side of the display panel DP. The laminated structures of the display module DM will be described in more detail below.

The display panel DP may be, for example, an emission-type display panel, such as an organic light emitting display panel, or an inorganic light emitting display panel, but is not particularly limited thereto.

The display panel DP may include a display area DP-DA and a non-display area DP-NDA, which correspond to the display area DA and the non-display area NDA (e.g., see FIG. 1A), respectively. As used in the present specification, when an area/portion is described as "corresponding to" or "corresponds to" another area/portion, the area/portion may be understood as overlapping with the other area/portion, but the overlapping is not limited to the same area.

As shown in FIG. 2, a driving chip DIC may be disposed at (e.g., in or on) the non-display area DP-NDA of the display panel DP. A flexible circuit board FCB may be bonded to the non-display area DP-NDA of the display panel DP. The flexible circuit board FCB may be connected to a main circuit board. For example, the main circuit board may be an electronic component configuring the electronic module EM.

The driving chip DIC may include driving elements, for example, such as a data driving circuit, for driving pixels of the display panel DP. FIG. 2 illustrates a structure in which the driving chip DIC is mounted on the display panel DP, but the present disclosure is not limited thereto. For example, the driving chip DIC may be mounted on the flexible circuit board FCB.

The electronic module EM may include a control module (e.g., a controller), a wireless communication module (e.g., a wireless communication device), an image input module (e.g., an image input device), a sound input module (e.g., a microphone or a sound input device), a sound output module (e.g., a speaker or a sound output device), a memory, an external interface, and/or the like. The electronic module EM may include the main circuit board, and the modules may be mounted on the main circuit board, or may be electrically connected to the main circuit board through the flexible circuit board FCB. The electronic module EM is electrically connected to the power supply module PSM.

Referring to FIG. 2, the electronic module EM may be disposed in each of a first housing HM1 and a second housing HM2. The power supply module PSM may be disposed in each of the first housing HM1 and the second housing HM2. The electronic module EM disposed in the first housing HM1 and the electronic module EM disposed in the second housing HM2 may be electrically connected to each other through the flexible circuit board FCB.

In some embodiments, the electronic device ED may further include an electro-optical module (e.g., an electro-optical device). The electro-optical module may be an electronic component configured to output or receive an optical signal. The electro-optical module may include a camera module (e.g., a camera) and/or a proximity sensor. The camera module may capture an external image through a partial area of the display panel DP.

The housing HM shown in FIG. 2 is combined with (e.g., connected to or attached to) the window WM of the display device DD to accommodate the other modules. The housing HM is shown to include the first and second housings HM1 and HM2 that are spaced apart from each other, but the present disclosure is not limited thereto. Although not shown in the drawing, the electronic device ED may further include a hinge structure configured to connect the first and second housings HM1 and HM2 to each other.

Figure 3:
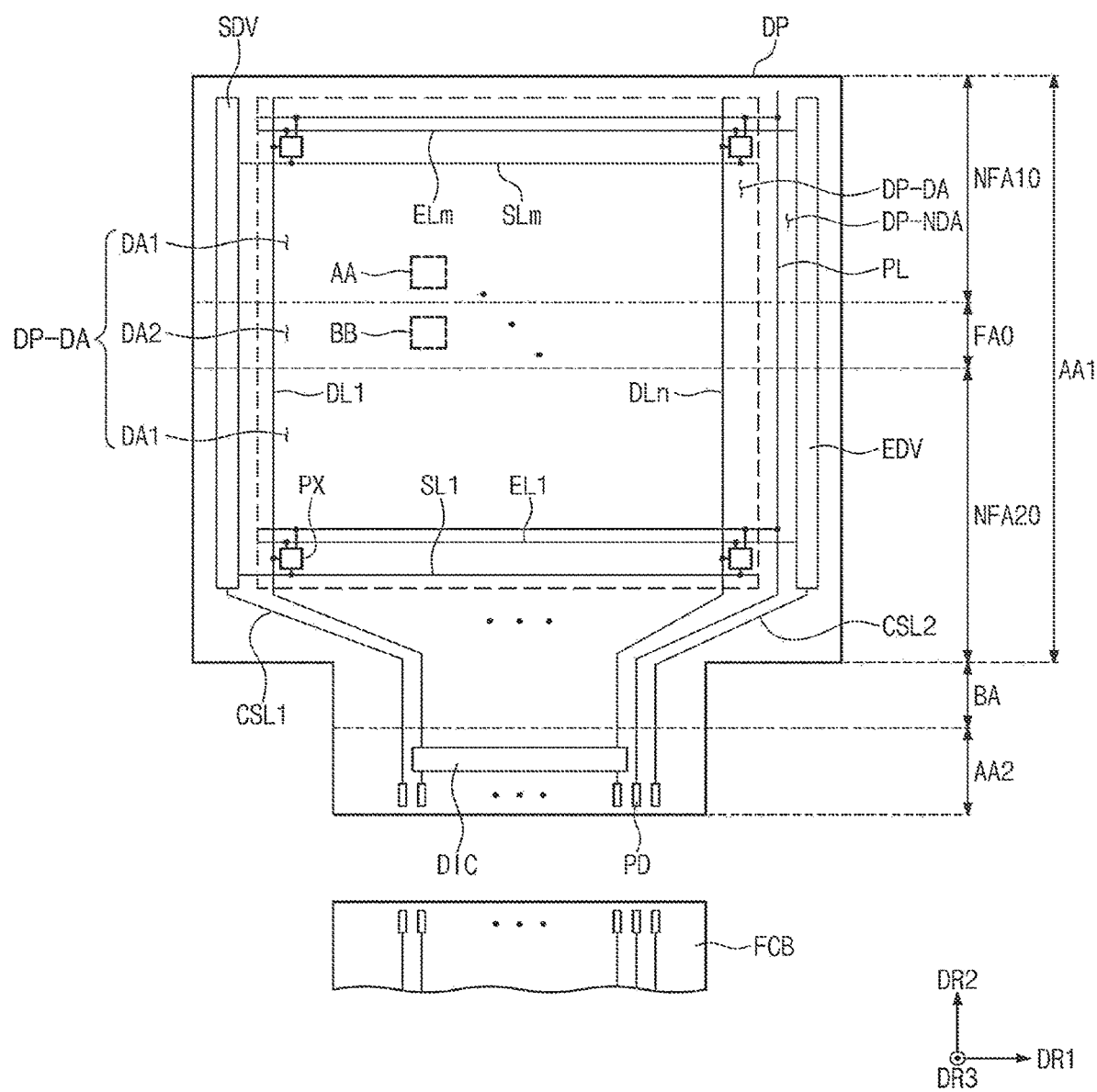
FIG. 3 is a plan view of a display panel according to an embodiment of the present disclosure.

FIG. 3 is a plan view of a display panel DP according to an embodiment of the present disclosure.

Referring to FIG. 3, the display surface DS may include the display area DP-DA, and the non-display area DP-NDA around (e.g., adjacent to or surrounding around a periphery of) the display area DP-DA. Pixels PX are disposed at (e.g., in or on) the display area DP-DA. A scan driving unit (e.g., a scan driver) SDV, a data driving unit (e.g., a data driver), and an emission driving unit (e.g., an emission driver) EDV may be disposed at (e.g., in or on) the non-display area DP-NDA. The data driving unit may be a partial circuit configured in the driving chip DIC shown in FIG. 3.

The display panel DP includes a first area AA1, a bending area BA, and a second area AA2 that are divided along the second direction DR2. The second area AA2 and the bending area BA may be partial areas of the non-display area DP-NDA. The bending area BA is disposed between the first area AA1 and the second area AA2.

The first area AA1 corresponds to the display surface DS of FIG. 1A. The first area AA1 may include a first non-folding area NFA10, a second non-folding area NFA20, and a folding area FA0. The first non-folding area NFA10, the second non-folding area NFA20, and the folding area FA0 may correspond to the first non-folding area NFA1, the second non-folding area NFA2, and the folding area FA, respectively, shown in FIGS. 1A to 1C.

The display area DP-DA may include two first display areas DA1 corresponding to the first non-folding area NFA10 and the second non-folding area NFA20, respectively, and a second display area DA2 corresponding to the folding area FA0.

A length (e.g., a width) of the bending area BA and the second area AA2 in the first direction DR1 may be smaller than that of the first area AA1. An area in which the length in a bending axis direction is shorter may be bent more easily.

The display panel DP may include the plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. Here, m and n are natural numbers. The pixels PX may be connected to the scan lines SL1 to SLm, the data lines DL1 to DLn, and the emission lines EL1 to ELm.

The scan lines SL1 to SLm may extend in the first direction DR1 to be connected to the scan driver SDV. The data lines DL1 to DLn may extend in the second direction DR2 to be connected to the data driver DIC via the bending area BA. The emission lines EL1 to ELm may extend in the first direction DR1 to be connected to the emission driving unit EDV.

The power line PL may include a portion extending in the second direction DR2, and a portion extending in the first direction DR1. The portion extending in the first direction DR1 and the portion extending in the second direction DR2 may be disposed at (e.g., in or on) different layers from each other. The portion extending in the second direction DR2 of the power line PL may extend to the second area AA2 via the bending area BA. The power line PL may provide a first power supply voltage ELVDD (see FIG. 6A) to the pixels PX.

The first control line CSL1 may be connected to the scan driving unit SDV, and may extend towards the lower end of the second area AA2 via the bending area BA. The second control line CSL2 may be connected to the emission driving unit EDV, and may extend towards the lower end of the second area AA2 via the bending area BA.

In a plan view, the pads PD may be disposed adjacent to the lower end of the second area AA2. The driving chip DIC, the power line PL, the first control line CSL1, and the second control line CSL2 may be connected to the pads PD. The flexible circuit board FCB may be electrically connected to the pads PD through an anisotropic conductive adhesive layer.

Figure 4:
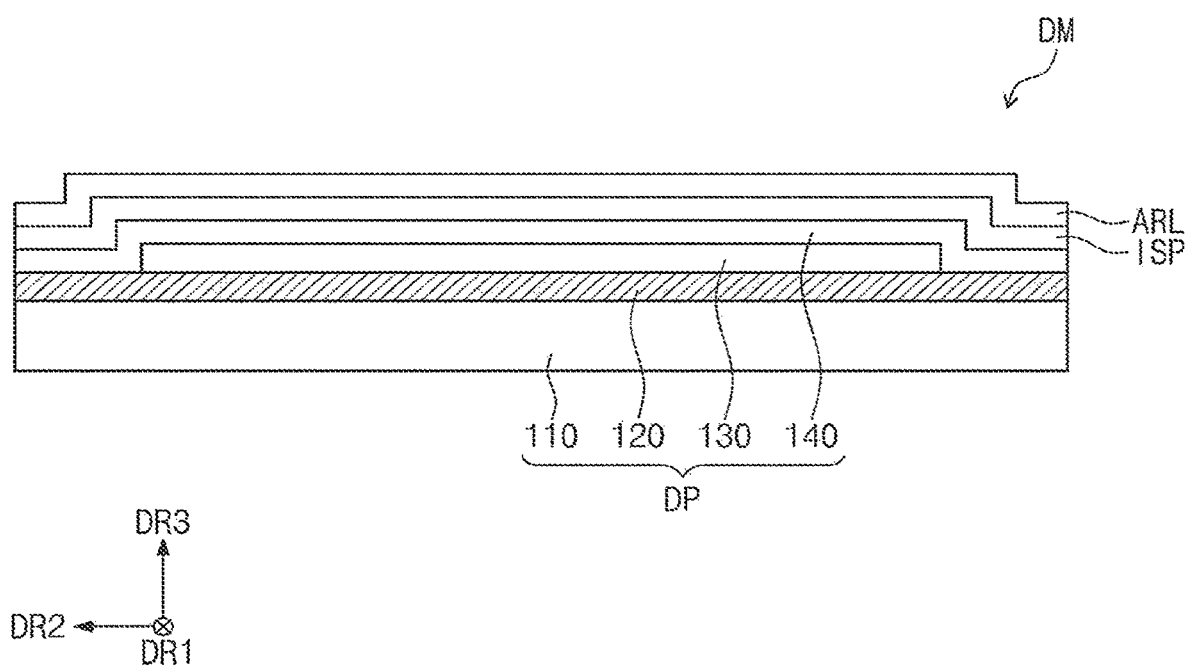
FIG. 4 is a cross-sectional view of a display module according to an embodiment of the present disclosure.

FIG. 4 is a cross-sectional view of the display module DM according to an embodiment of the present disclosure.

Referring to FIG. 4, the display module DM may include a display panel DP, an input sensor ISP, and an anti-reflection layer ARL. The display panel DP may include a base layer 110, a circuit layer 120, a light-emitting element layer 130, and an encapsulation layer 140.

The base layer 110 may provide a base surface on which the circuit layer 120 is disposed. The base layer 110 may be a flexible substrate that is bendable, foldable, rollable, and/or the like. The base layer 110 may be a glass substrate, a metal substrate, or a polymer substrate. However, the present disclosure is not limited thereto, and the base layer 110 may be an inorganic layer, an organic layer, or a composite material layer.

The base layer 110 may have a multi-layered structure. For example, the base layer 110 may include a first synthetic resin layer, an inorganic layer of a single layer or multi-layers, and a second synthetic resin layer disposed on the single or multi-layered inorganic layer. Each of the first and second synthetic resin layers may include a polyimide-based resin, but is not particularly limited thereto.

The circuit layer 120 may be disposed on the base layer 110. The circuit layer 120 may include an insulation layer, a semiconductor pattern, a conductive pattern, a signal line, and the like.

The light emitting element layer 130 may be disposed on the circuit layer 120. The light emitting element layer 130 may include a light emitting element. For example, the light-emitting element may include an organic light-emitting material, an inorganic light-emitting material, an organic-inorganic light-emitting material, a quantum dot, a quantum rod, a micro LED, or a nano-LED.

The encapsulation layer 140 may be disposed on the light-emitting element layer 130. The encapsulation layer 140 may protect the light-emitting element layer 130 from foreign matter, such as moisture, oxygen, and/or dust particles. The encapsulation layer 140 may include at least one inorganic layer. The encapsulation layer 140 may include a laminated structure of an inorganic layer/an organic layer/an inorganic layer.

The input sensor ISP may be directly disposed on the display panel DP. The input sensor ISP may sense a user input in a capacitive manner. The display panel DP and the input sensor ISP may be provided through continuous processes. Here, "directly disposed" may mean that a third component is not disposed between two components (e.g., between the input sensor ISP and the display panel DP). In other words, a separate adhesive layer may not be disposed between the input sensor ISP and the display panel DP.

The anti-reflection layer ARL may be directly disposed on the input sensor ISP. The anti-reflection layer ARL may reduce a reflection ratio of external light incident from the outside of the display device DD. The anti-reflection layer ARL may include color filters. The color filters may have a suitable array (e.g., a predetermined or prescribed array). For example, the color filters may be arrayed in consideration of emission colors of the pixels PX included in the display panel DP. In addition, the anti-reflection layer ARL may further include a black matrix adjacent to the color filters.

In an embodiment of the present disclosure, the positions of the input sensor ISP and the anti-reflection layer ARL may be exchanged with each other. In an embodiment of the present disclosure, the anti-reflection layer ARL may be replaced with a polarization film. The polarization film may be combined (e.g., connected or attached) to the input sensor ISP through an adhesive layer.

Figure 5A:
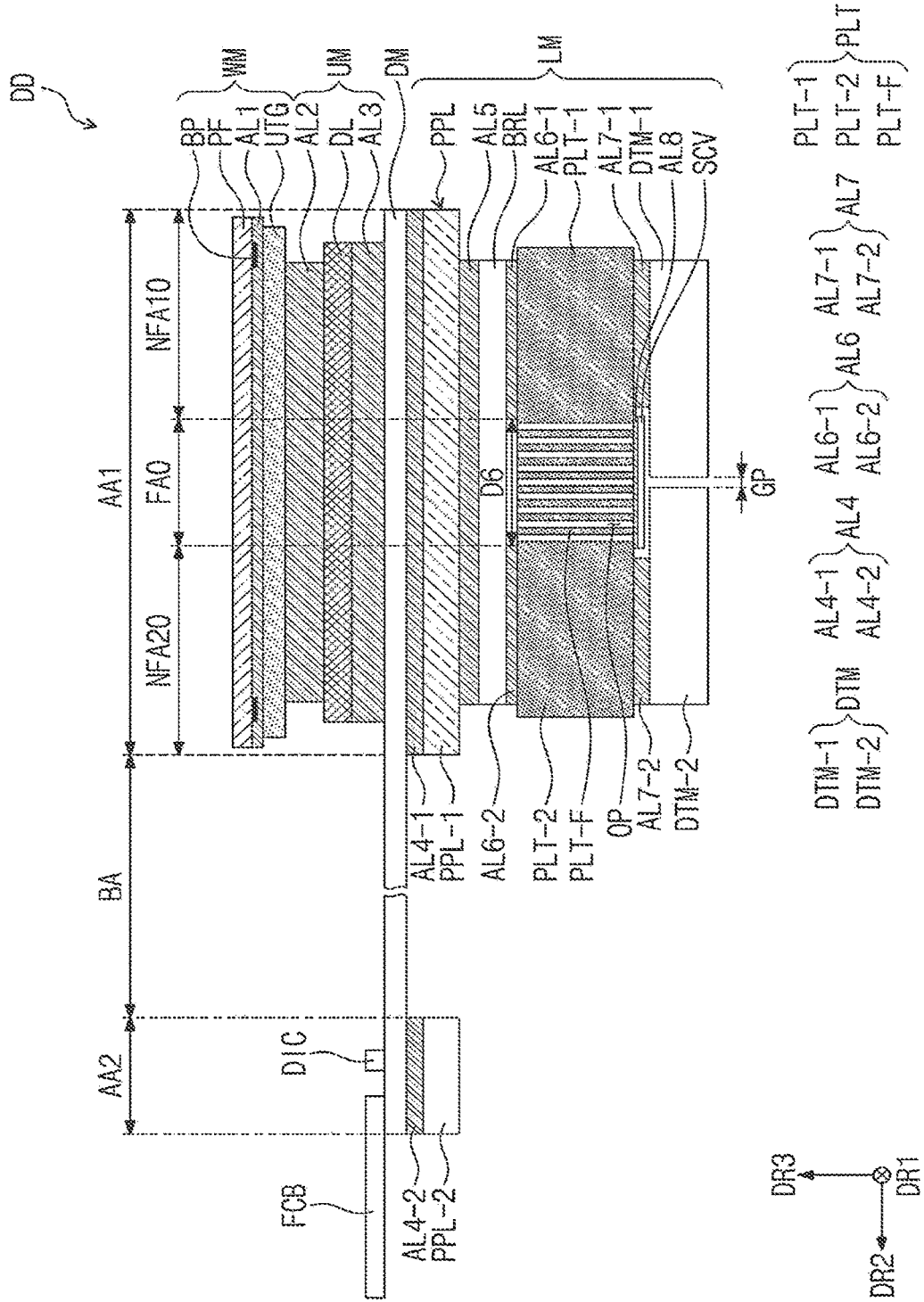
FIG. 5A is a cross-sectional view of a display device according to an embodiment of the present disclosure.
Figure 5B:
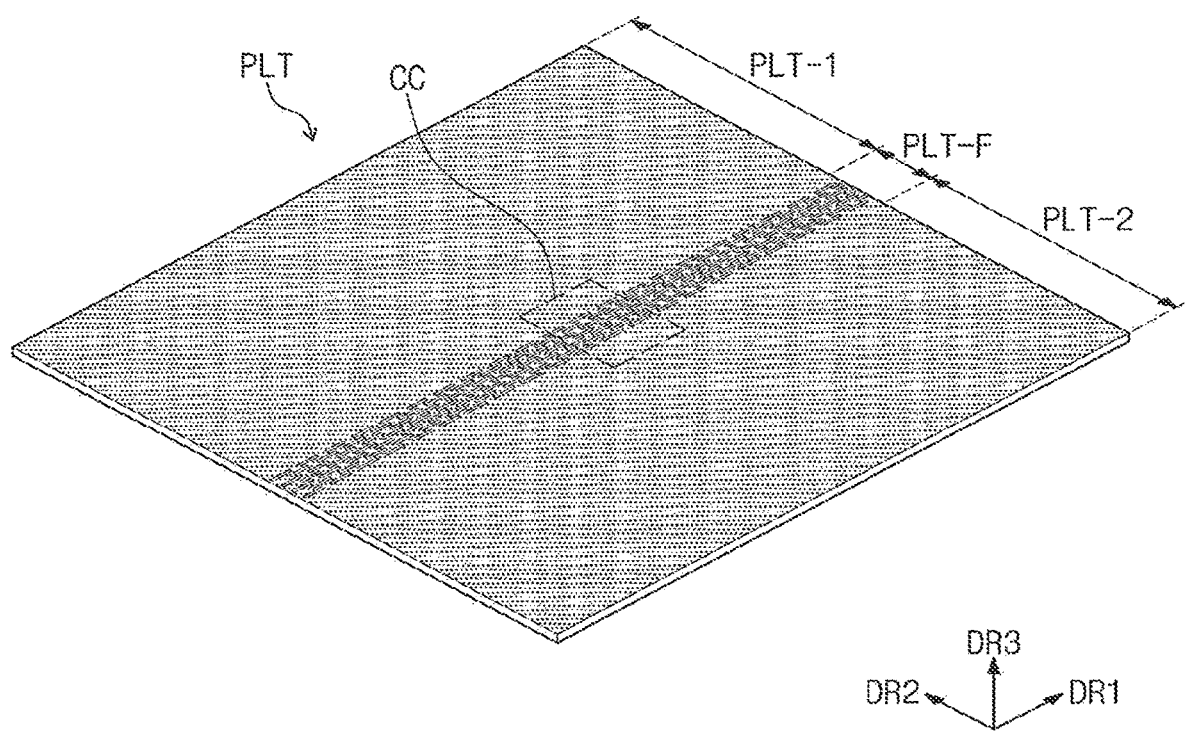
FIG. 5B is a plan view of a support plate according to an embodiment of the present disclosure.
Figure 5C:
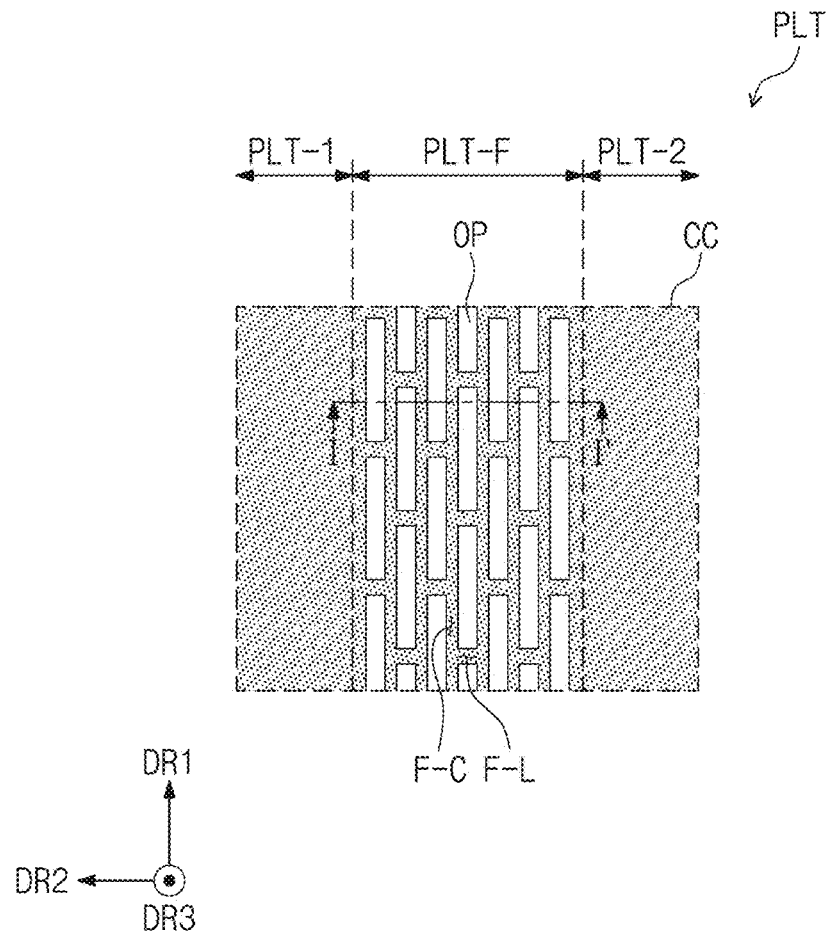
FIG. 5C is an enlarged plan view of a portion of the support plate shown in FIG. 5B.
Figure 5D:
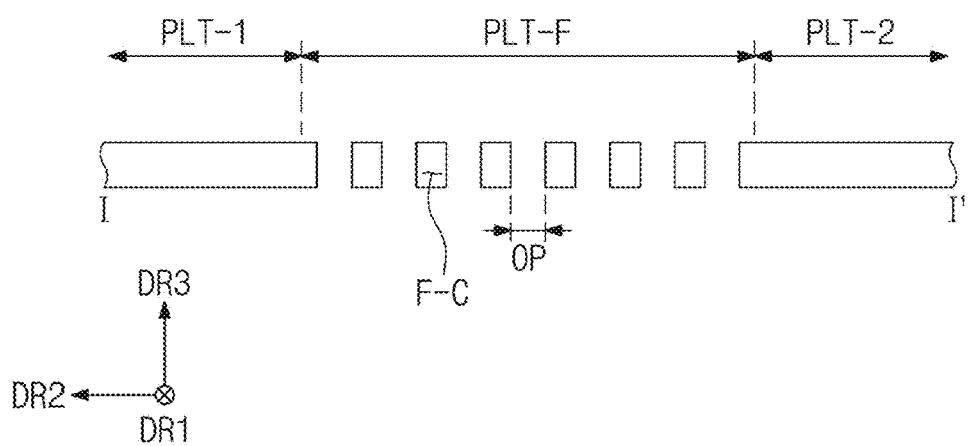
FIG. 5D is a cross-sectional view corresponding to the line I-I' of FIG. 5O.
Figure 5E:
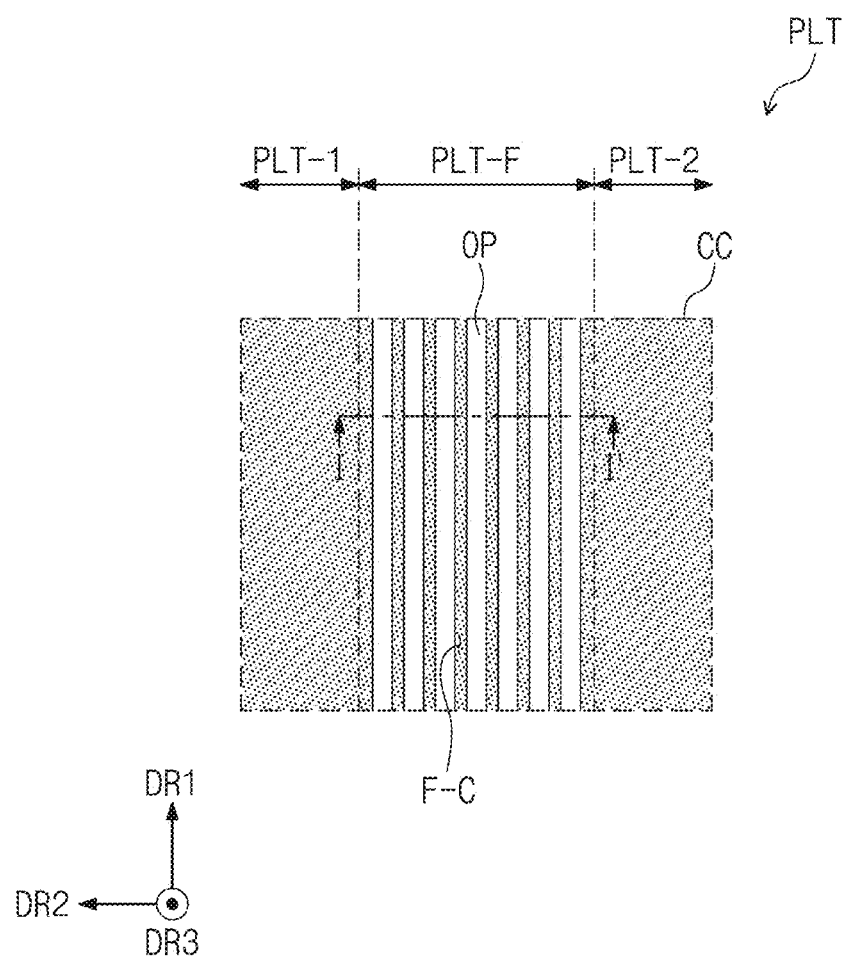
FIG. 5E is an enlarged plan view of a portion of the support plate shown in FIG. 5B.

FIG. 5A is a cross-sectional view of the display device DD according to an embodiment of the present disclosure. FIG. 5B is a plan view of a support plate PLT according to an embodiment of the present disclosure. FIG. 5C is an enlarged plan view of a portion of the support plate PLT shown in FIG. 5B. FIG. 5D is a cross-sectional view corresponding to the line I-I' of FIG. 5C. FIG. 5E is an enlarged plan view of a portion of the support plate PLT shown in FIG. 5B.

FIG. 5A shows an unfolded state in which the display module DM is not folded. In FIG. 5A, regions for distinguishing the display module DM are shown on the basis of the display panel DP of FIG. 3.

Referring to FIG. 5A, the display device DD includes a window WM, an upper member UM, the display module DM, and a lower member LM. Components disposed between the window WM and the display module DM is integrally referred to as the upper member UM, and components disposed at (e.g., in or on) a lower side of the display module DM are integrally referred to as the lower member LM.

The window WM may include a thin-film glass substrate UTG, a window protection layer PF disposed on the thin-film glass substrate UTG, and a bezel pattern BP disposed on a bottom surface of the window protection layer PF. In the present embodiment, the window protection layer PF may include a synthetic resin film. The window WM may include an adhesive layer AL1 (hereinafter, referred to as a first adhesive layer) configured to bond the window protection layer PF and the thin-film glass substrate UTG to each other.

The bezel pattern BP overlaps with the non-display area NDA shown in FIG. 1A. The bezel pattern BP may be disposed on one surface of the thin-film glass substrate UTG, or of the window protection layer PF. FIG. 5A illustrates an example of the bezel pattern BP disposed on the bottom surface of the window protection layer PF. However, the present disclosure is not limited thereto, and the bezel pattern BP may be disposed on a top surface of the window protection layer PF. The bezel pattern BP may be provided as a colored shielding film, for example, in a coating manner. The bezel pattern BP may include a base material, and a dye or pigment mixed with the base material.

A thickness of the thin-film glass substrate UTG may be about 15 µm to about 45 µm. The thin-film glass substrate UTG may be chemical strengthening glass. The thin-film glass substrate UTG may minimize or reduce the generation of a fold, even when folding and unfolding are repeated.

A thickness of the window protection layer PF may be about 50 µm to about 80 µm. The synthetic resin film of the window protection layer PF may include Polyimide, Polycarbonate, Polyamide, Triacetylcellulose, Polymethylmethacrylate, or Polyethylene terephthalate. In some embodiments, at least one of a hard coating layer, an anti-fingerprint layer, or an anti-reflection layer may be disposed on the top surface of the window protection layer PF.

The first adhesive layer AL1 may be provided with a Pressure Sensitive Adhesive (PSA) film, or an Optically Clear Adhesive (OCA). The adhesive layers described below may also include the same type of adhesive as that of the first adhesive layer AL1.

The first adhesive layer AL1 may be separated from the thin-film glass substrate UTG. For example, the window protection layer PF may have a lower strength than that of the thin-film glass substrate UTG, and thus, may be relatively easily scratched. After the first adhesive layer AL1 is separated from the window protection layer PF, a new window protection layer PF may be adhered to the thin-film glass substrate UTG.

The upper member UM includes a top film DL. The top film DL may include a synthetic resin film. The synthetic resin film may include Polyimide, Polycarbonate, Polyamide, Triacetylcellulose, Polymethylmethacrylate, or Polyethylene terephthalate.

The top film DL may absorb an external impact applied to the front surface of the display device DD. The display module DM described above with reference to FIG. 4 may include the anti-reflection layer ARL that replaces the polarization film, and thus, a front impact strength of the display device DD may be reduced. The top film DL may compensate for the reduced impact strength by employing the anti-reflection layer ARL. In an embodiment of the present disclosure, the top film DL may be omitted as needed or desired. The upper member UM may include a second adhesive layer AL2 configured to bond the top film DL and the window WM to each other, and a third adhesive layer AL3 configured to bond the top film DL and the display module DM to each other.

The lower member LM may include a panel protection layer PPL, a barrier layer BRL, a support plate PLT, a cover layer SCV, a digitizer DTM, and fourth to eighth adhesive layers AL4 to AL8. In an embodiment of the present disclosure, some of the foregoing components may be omitted as needed or desired. For example, the barrier layer BRL, the cover layer SCV, or the digitizer DTM, and the adhesive layers related thereto, may be omitted as needed or desired.

The panel protection layer PPL may be disposed under (e.g., underneath) the display module DM. The panel protection layer PPL may protect the bottom (e.g., the rear) of the display panel DM. The panel protection layer PPL may include a flexible synthetic resin film. For example, the panel protection layer PPL may include polyethylene terephthalate.

In an embodiment of the present disclosure, the panel protection layer PPL may not be disposed at (e.g., in or on) the bending area BA. The panel protection layer PPL may include a first panel protection layer PPL-1 configured to protect the first area AA1, and a second panel protection layer PPL-2 configured to protect the second area AA2.

The fourth adhesive layer AL4 bonds the panel protection layer PPL and the display panel DP to each other. The fourth adhesive layer AL4 may include a first portion AL4-1 corresponding to the first panel protection layer PPL-1, and a second portion AL4-2 corresponding to the second panel protection layer PPL-2.

When the bending area BA is bent, the second panel protection layer PPL-2 may be disposed under (e.g., underneath) the first area AA1 and the first panel protection layer PPL-1, together with the second area AA2. Because the panel protection layer PPL is not disposed at (e.g., in or on) the bending area BA, the bending area BA may be more easily bent.

As shown in FIG. 5A, the fifth adhesive layer AL5 bonds the panel protection layer PPL and the barrier layer BRL to each other. The barrier layer BRL may be disposed under (e.g., underneath) the panel protection layer PPL. The barrier layer BRL may increase a resistance force to a compressive force according to external compression. Accordingly, the barrier layer BRL may serve to block the display panel DP from being modified. The barrier layer BRL may include a flexible plastic material, such as Polyimide or Polyethylene terephthalate. In addition, the barrier layer BRL may be a colored film, the light transmittance thereof which is low. The barrier layer BRL may absorb light incident externally. For example, the barrier layer BRL may be a black synthetic resin. When the display device DD is viewed from the top of the window protection layer PF, components disposed under (e.g., underneath) the barrier layer BRL may not be visible to the user.

The sixth adhesive layer AL6 bonds the barrier layer BRL and the support plate PLT to each other. The sixth adhesive layer AL6 may include a first portion AL6-1 and a second portion AL6-2 that are spaced apart from each other. A distance D6 (or interval) between the first portion AL6-1 and the second portion AL6-2 corresponds to a width of the folding area FA0, and may be larger than a gap GP that will be described in more detail below.

The support plate PLT is disposed under (e.g., underneath) the barrier layer BRL. The support plate PLT supports components disposed at (e.g., in or on) an upper side of the support plate PLT, and maintains or substantially maintains an unfolded state and a folded state of the display device DD. The support plate PLT may have a larger strength than that of the barrier layer BRL.

The support plate PLT may include a metal material having a higher strength. The support plate PLT may include a substance having an elastic modulus of 60 GPa or higher. The support plate PLT may include a metal substance, such as stainless steel.

The support plate PLT may also include a fiber-reinforced composite. The support plate PLT may include a reinforced fiber disposed inside a matrix unit. The reinforced fiber may be carbon fiber, or glass fiber. The matrix unit may include a polymer resin. The matrix unit may include a thermoplastic resin. For example, the matrix unit may include a polyamide-based resin or a polypropylene-based resin. For example, the fiber-reinforced composite may be carbon fiber-reinforced plastic (CFRP) or glass fiber-reinforced plastic (GFRP).

Referring to FIGS. 5A through 5D, the support plate PLT may include at least a first support part PLT-1 corresponding to the first non-folding area NFA10, and a second support part PLT-2 corresponding to the second non-folding area NFA20. The support plate PLT may include a folding part PLT-F that corresponds to the folding area FA0, and is disposed between the first support part PLT-1 and the second support part PLT-2. A plurality of openings OP are defined in the folding part PLT-F. The first support part PLT-1, the second support part PLT-2, and the folding part PLT-F may have an integrated shape.

As described above with reference to FIGS. 1A through 1C, the shape of the folding part PLT-F changes as the electronic device ED changes from a first mode to a second mode, but the shapes of the first support part PLT-1 and the second support part PLT-2 are not changed. Each of the first support part PLT-1 and the second support part PLT-2 provides a planar support surface, regardless of an operation mode. The first support part PLT-1 and the second support part PLT-2 may be defined as a first area in which the shapes thereof are not changed according to a change in the operation mode of the electronic device ED. The folding part PLT-F may be defined as a second area in which the shape thereof is changed according to the operation mode change of the electronic device ED.

As shown in FIG. 5C, the plurality of openings OP may be arrayed, so that the folding area FA0 has a lattice shape in a plan view. The flexibility of the folding part PLT-F is improved by the plurality of openings OP. During the folding operation shown in FIGS. 1B and 1C, the folding part PLT-F may prevent or substantially prevent foreign matter from being permeated from the first support part PLT-1 and the second support part PLT-2 to an open center area of the barrier layer BRL. The flexibility of the folding part PLT-F is improved by the plurality of openings OP.

As shown in FIG. 5C, the plurality of openings OP are defined in the folding part PLT-F. An area other than the plurality of openings OP is defined as a support area. The support area may include first extension parts F-C and second extension parts F-L. Each of the first extension parts F-C extends in the first direction DR1, and the first extension parts F-C are arrayed along the second direction DR2. Each of the second extension parts F-L extends in the second direction DR2, and is disposed between adjacent first extension parts F-C. The first extension parts F-C and the second extension parts F-L may define a lattice shape. The first extension parts F-C may be positioned, so that the plurality of openings OP are disposed in a zig-zag manner along the second direction DR2.

As shown in FIG. 5D, each of the plurality of openings OP may have a uniform or substantially uniform width. In other words, the width of each of the plurality of openings OP may not change in the third direction DR3, and may have a constant or substantially constant value.

Referring to FIG. 5E, unlike the embodiment shown in FIG. 5C, the second extension parts F-L may be omitted. Each of the first extension parts F-C may correspond to a stick member (e.g., a stick shape) extending in the first direction DR1. The stick members may be arrayed between the first support part PLT-1 and the second support part PLT-2 at a uniform or substantially uniform interval along the second direction DR2.

As shown in FIG. 5B, a length of the stick members may be the same or substantially the same as the length of the first support part PLT-1 or the second support part PLT-2 in the first direction DR1. Areas between the stick members may correspond to the openings OP.

Referring to FIG. 5A, the cover layer SCV and the digitizer DTM may be disposed under (e.g., underneath) the support plate PLT. The cover layer SCV is disposed to overlap with the folding area FA0. The digitizer DTM may include a first digitizer DTM-1 and a second digitizer DTM-2 overlapping with the first support part PLT-1 and the second support part PLT-2, respectively. A portion of each of the first digitizer DTM-1 and the second digitizer DTM-2 may be disposed under (e.g., underneath) the cover layer SCV.

The seventh adhesive layer AL7 bonds the support plate PLT and the digitizer DTM to each other, and the eighth adhesive layer AL8 bonds the cover layer SCV and the support plate PLT to each other. The seventh adhesive layer AL7 may include a first part AL7-1 configured to bond the first support part PLT-1 and the first digitizer DTM-1 to each other, and a second part AL7-2 configured to bond the second support part PLT-2 and the second digitizer DTM-2 to each other.

The cover layer SCV may be disposed between the first part AL7-1 and the second part AL7-2 in the second direction DR2. The cover layer SCV may be spaced apart from the digitizer DTM to prevent or substantially prevent interference to the digitizer DTM in an unfolded state. A sum of the thicknesses of the cover layer SCV and the eighth adhesive layer AL8 may be smaller than a thickness of the seventh adhesive layer AL7.

The cover layer SCV may cover the openings OP of the folding part PLT-F. The cover layer SCV may have a lower elastic modulus than that of the support plate PLT. For example, the cover layer SCV may include thermoplastic polyurethane, rubber, or silicon, but the present disclosure is not limited thereto.

The digitizer DTM may be referred to as an EMR sensing panel, and includes a plurality of loop coils configured to generate a magnetic field of a suitable resonance frequency (e.g., a predetermined or preset resonance frequency) with an electronic pen. The magnetic field provided by the loop coils is applied to an LC resonance circuit configured from an inductor (coil) and a capacitor of the electronic pen. The coils generate a current by means of the received magnetic field, and deliver the generated current to the capacitor. Accordingly, the capacitor is charged with the current input from the coils, and the charge current is discharged to the coils. Then, the magnetic field of the resonance frequency is emitted to the coils. The magnetic field emitted by the electronic pen may be absorbed again by the loop coils of the digitizer, and accordingly, it may be determined at which position on a touch screen that the electronic pen is located.

The first digitizer DTM-1 and the second digitizer DTM-2 are spaced apart from each other with the gap (e.g., the predetermined or prescribed gap) GP defined therebetween. The gap GP may be about 0.3 mm to 3 mm, and may be disposed to correspond to the folding area FA0.

Figure 6A:
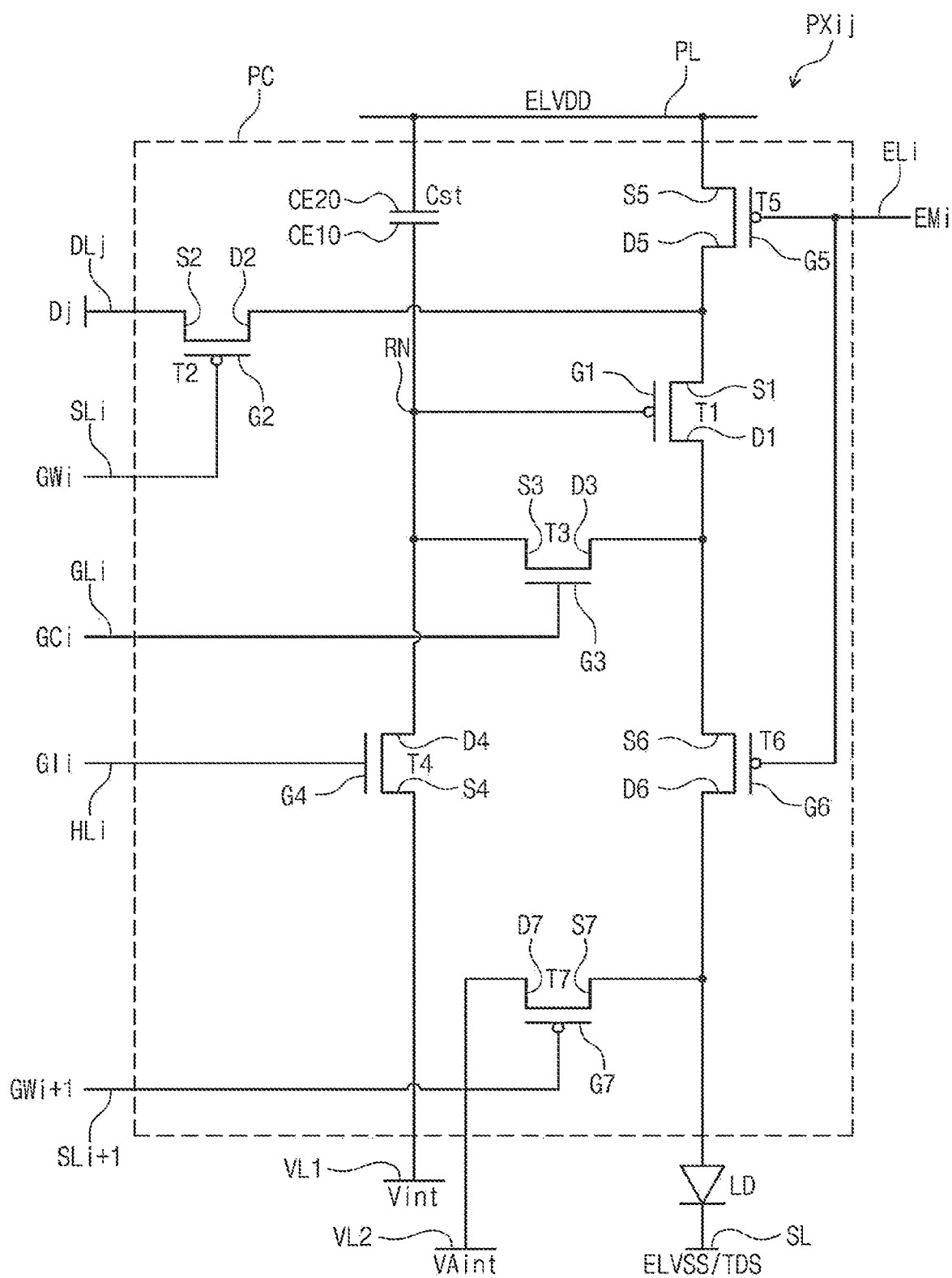
FIG. 6A is an equivalent circuit diagram of a pixel according to an embodiment of the present disclosure.
Figure 6B:
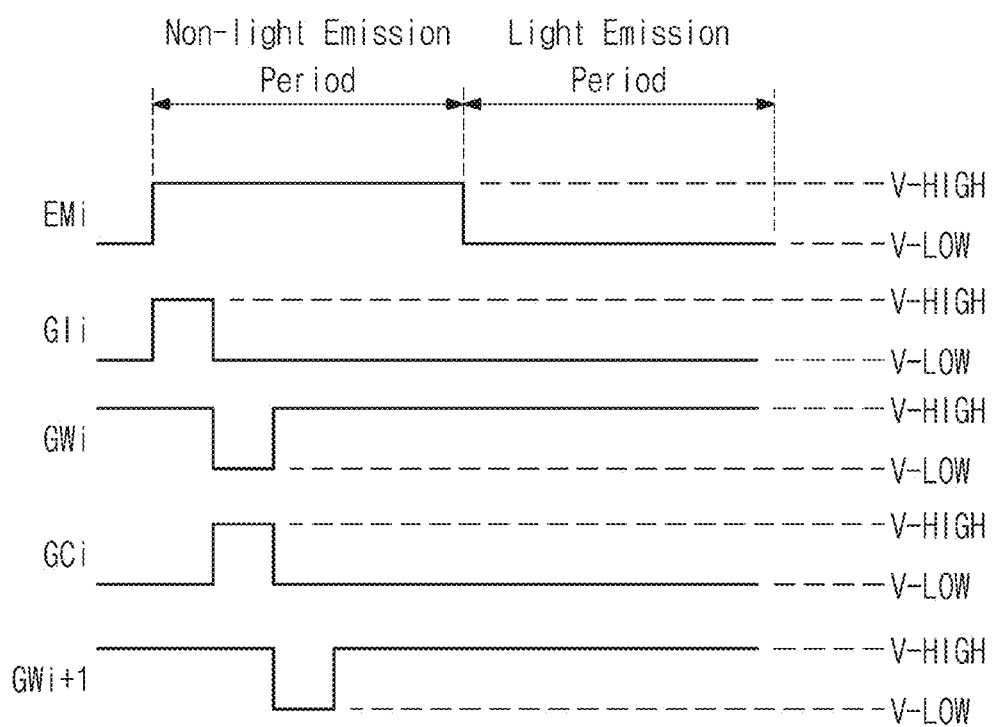
FIG. 6B is a timing diagram illustrating a pixel driving method according to an embodiment of the present disclosure.

FIG. 6A is an equivalent circuit diagram of a pixel PXij according to an embodiment of the present disclosure. FIG. 6B is a timing diagram illustrating a pixel driving method according to an embodiment of the present disclosure.

FIG. 6A illustrates an example of a pixel PXij connected to an i-th scan line SLi and a j-th data line DLj of a first group, where i and j are natural numbers. The pixel PXij may include a pixel driving circuit PC (hereinafter, referred to as a pixel circuit PC) and a light emitting element LD.

In the present embodiment, the pixel circuit PC may include first to seventh transistors T1 to T7, and a capacitor Cst. In the present embodiment, the first transistor T1, the second transistor T2, and the fifth transistor T5 to the seventh transistor T7 are P-type transistors, and the third transistor T3 and the fourth transistor T4 are N-type transistors. However, the present disclosure is not limited thereto, and each of the first to seventh transistors T1 to T7 may be implemented with any suitable one of a P-type transistor or an N-type transistor. An input area (e.g., an input electrode) of the N-type transistor is described as a drain (e.g., a drain area), and an input area of the P-type transistor is described as a source (e.g., a source area). An output area (e.g., an output electrode) of the N-type transistor is described as a source (e.g., a source area), and an output area of the P-type transistor is described as a drain (e.g., a drain area). In addition, in an embodiment of the present disclosure, at least one of the first to seventh transistors T1 to T7 may be omitted as needed or desired.

In the present embodiment, the first transistor T1 may be a driving transistor, and the second transistor T2 may be a switching transistor. The capacitor Cst is electrically connected between a reference node RN and a power line PL through which a first power supply voltage ELVDD is received. The capacitor Cst includes a first electrode CE10 electrically connected to the reference node RN, and a second electrode CE20 electrically connected to the power line PL.

The light emitting element LD is electrically connected between the first transistor T1 and a signal line SL. The signal line SL may provide a second power supply voltage ELVSS or a driving signal TDS to a cathode of the light emitting element LD. The second power supply voltage ELVSS may have a lower level than that of the first power supply voltage ELVDD.

The first transistor T1 is electrically connected between the power line PL and an anode of the light emitting element LD. A source S1 of the first transistor T1 is electrically connected to the power line PL. As used in the present specification, "electrically connected between a transistor and a signal line or between a transistor and another transistor" means that "a source, a drain, and a gate of the transistor have an integrated shape with the signal line or are connected through connection electrodes". Another transistor may be disposed or may not be disposed between the source S1 of the first transistor T1 and the power line PL.

The drain D1 of the first transistor T1 is electrically connected to the anode of the light emitting element LD. Another transistor may be disposed or may not be disposed between the drain D1 of the first transistor T1 and the anode of the light emitting element LD. A gate G1 of the first transistor T1 is electrically connected to the reference node RN.

The second transistor T2 is electrically connected between a j-th data line DLj and the source S1 of the first transistor T1. The source S2 of the second transistor T2 is electrically connected to the j-th data line DLj, and a drain D2 of the second transistor T2 is electrically connected to the source S1 of the first transistor T1. In the present embodiment, the gate G2 of the second transistor T2 may be electrically connected to an i-th scan line SLi of the first group.

The third transistor T3 is electrically connected between the reference node RN and the drain D1 of the first transistor T1. A drain D3 of the third transistor T3 is electrically connected to the drain D1 of the first transistor T1, and a source S3 of the third transistor T3 is electrically connected to the reference node RN. The third transistor T3 is illustrated as having a single gate, but in some embodiments, the third transistor T3 may include a plurality of gates. In the present embodiment, a gate G3 of the third transistor T3 may be electrically connected to an i-th scan line GLi of a second group. The fourth transistor T4 is electrically connected between the reference node RN and a first voltage line VL1. A drain D4 of the fourth transistor T4 is electrically connected to the reference node RN, and a source S4 of the fourth transistor T4 is electrically connected to the first voltage line VL1. The fourth transistor T4 is illustrated as having a single gate, but in some embodiments, the fourth transistor T4 may include a plurality of gates. In the present embodiment, a gate G4 of the fourth transistor T4 may be electrically connected to an i-th scan line HLi of a third group.

The fifth transistor T5 is electrically connected between the power line PL and the source S1 of the first transistor T1. A source S5 of the fifth transistor T5 is electrically connected to the power line PL, and a drain D5 of the fifth transistor T5 is electrically connected to the source S1 of the first transistor T1. A gate of the fifth transistor T5 may be electrically connected to the i-th emission line ELi.

The sixth transistor T6 is electrically connected between the light emitting element LD and the drain D1 of the first transistor T1. A source S6 of the sixth transistor T6 is electrically connected to the drain D1 of the first transistor T1, and a drain D6 of the sixth transistor T6 is electrically connected to the anode of the light emitting element LD. A gate G6 of the sixth transistor T6 may be electrically connected to the i-th emission line ELi. In an embodiment of the present disclosure, the gate G6 of the sixth transistor T6 may be connected to a signal line different from that of the gate G5 of the fifth transistor T5.

The seventh transistor T7 is electrically connected between the second voltage line VL2 and the drain D6 of the sixth transistor T6. A source S7 of the seventh transistor T7 is electrically connected to the drain D6 of the sixth transistor T6, and a drain D7 of the seventh transistor T7 is electrically connected to the second voltage line VL2. A gate G7 of the seventh transistor T7 may be electrically connected to an (i+1)-th scan line SLi+1 of the first group.

An operation of the pixel PXij will be described in more detail with reference to FIG. 6B. Referring to FIG. 6B, each of signals EMi, Gli, GWi, GCi, and GWi+1 may have a high level V-HIGH during a partial period, and a low level V-LOW during a partial period. Some of the signals EMi, Gli, GWi, GCi, and GWi+1 are illustrated as having the same or substantially the same pulse width as each other in FIG. 6B, but the present disclosure is not limited thereto. Each of the pulse widths of the signals EMi, Gli, GWi, GCi, and GWi+1 may be determined in consideration of a target turn-on period of each of the first to seventh transistors T1 to T7. The N-type transistors are turned on when corresponding signals have the high levels V-HIGH, and the P-type transistors are turned on when corresponding signals have the low levels V-LOW.

When the emission control signal EMi has the high level V-HIGH, the fifth transistor T5 and the sixth transistor T6 are turned off. When the fifth and sixth transistors T5 and T6 are turned off, a current path is not provided between the power line PL and the light emitting element LD. Accordingly, a corresponding period may be defined as a non-light emission period.

When a scan signal Gli is applied to the i-th scan line HLi of the third group, the fourth transistor T4 is turned on. When the fourth transistor T4 is turned on, the reference node RN is initialized by a first initialization voltage Vint.

When the scan signal GW1 applied to the i-th scan line SLi of the first group has the low level V-LOW, and the scan signal GCi applied to the i-th scan line GLi of the second group has the high level V-HIGH, the second transistor T2 and the third transistor T3 are turned on.

Because the reference node RN is initialized to the first initialization voltage Vint, the first transistor T1 is turned on. When the first transistor T1 is turned on, a voltage corresponding to a data signal Dj (e.g., see FIG. 6A) is provided to the reference node RN. In this case, the capacitor Cst stores the voltage corresponding to the data signal Dj. The voltage corresponding to the data signal Dj may be a voltage obtained by subtracting a threshold voltage Vth of the first transistor T1 from the data signal Dj.

When a scan signal GWi+1 applied to an (i+1)-th scan line SLi+1 of the first group has the low level V-LOW, the seventh transistor T7 is turned on. As the seventh transistor T7 is turned on, the anode of the light emitting element LD is initialized to a second initialization voltage VAint. A parasite capacitor of the light emitting element LD may be discharged.

When the emission control signal EMi has the low level V-LOW, the fifth transistor T5 and the sixth transistor T6 are turned on. When the fifth transistor T5 is turned on, the first power supply voltage ELVDD is provided to the first transistor T1. When the sixth transistor T6 is turned on, the first transistor T1 is electrically connected to the light emitting element LD. The light emitting element LD generates light having a luminance corresponding to the received current amount.

Figure 7A:
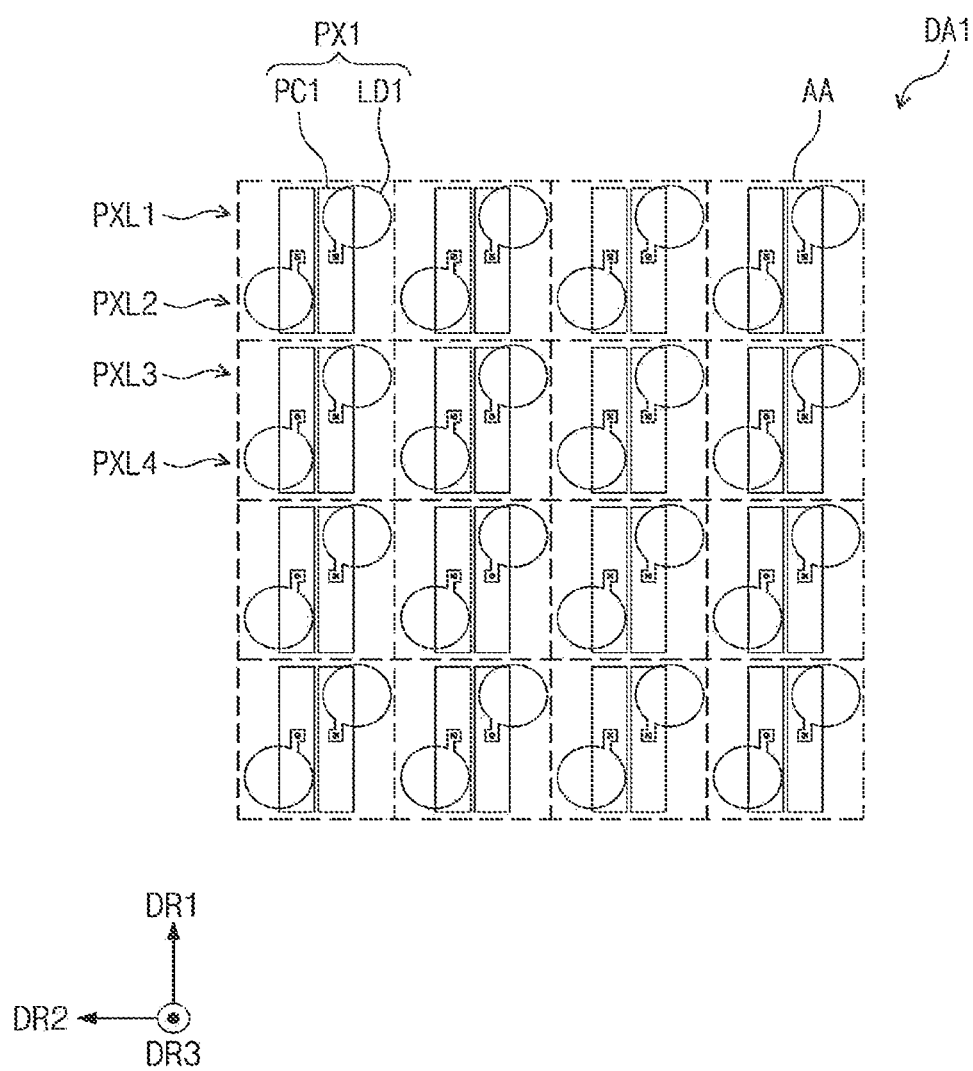
FIG. 7A is an enlarged plan view of a first display area according to an embodiment of the present disclosure.
Figure 7B:
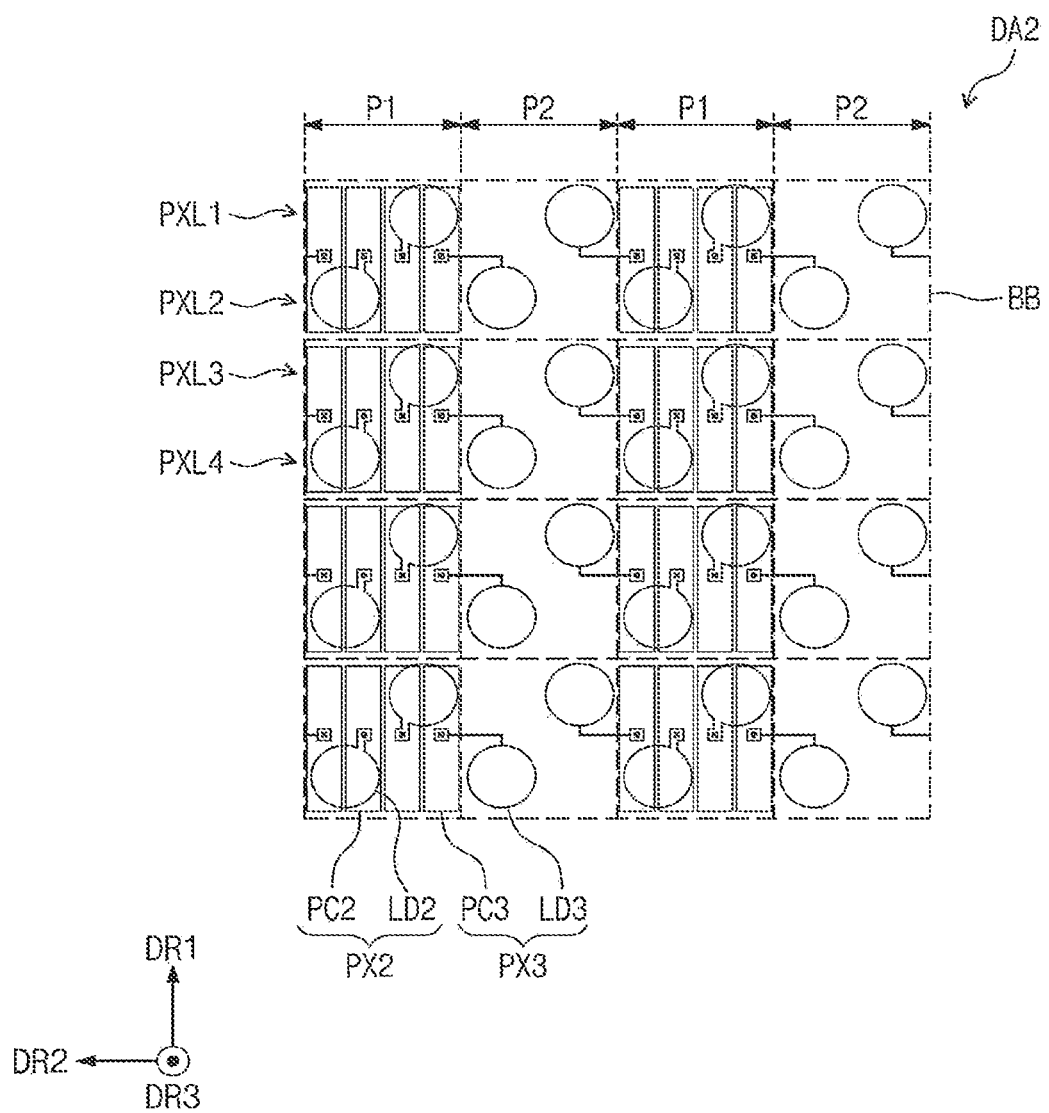
FIG. 7B is an enlarged plan view of a second display area according to an embodiment of the present disclosure.
Figure 7C:
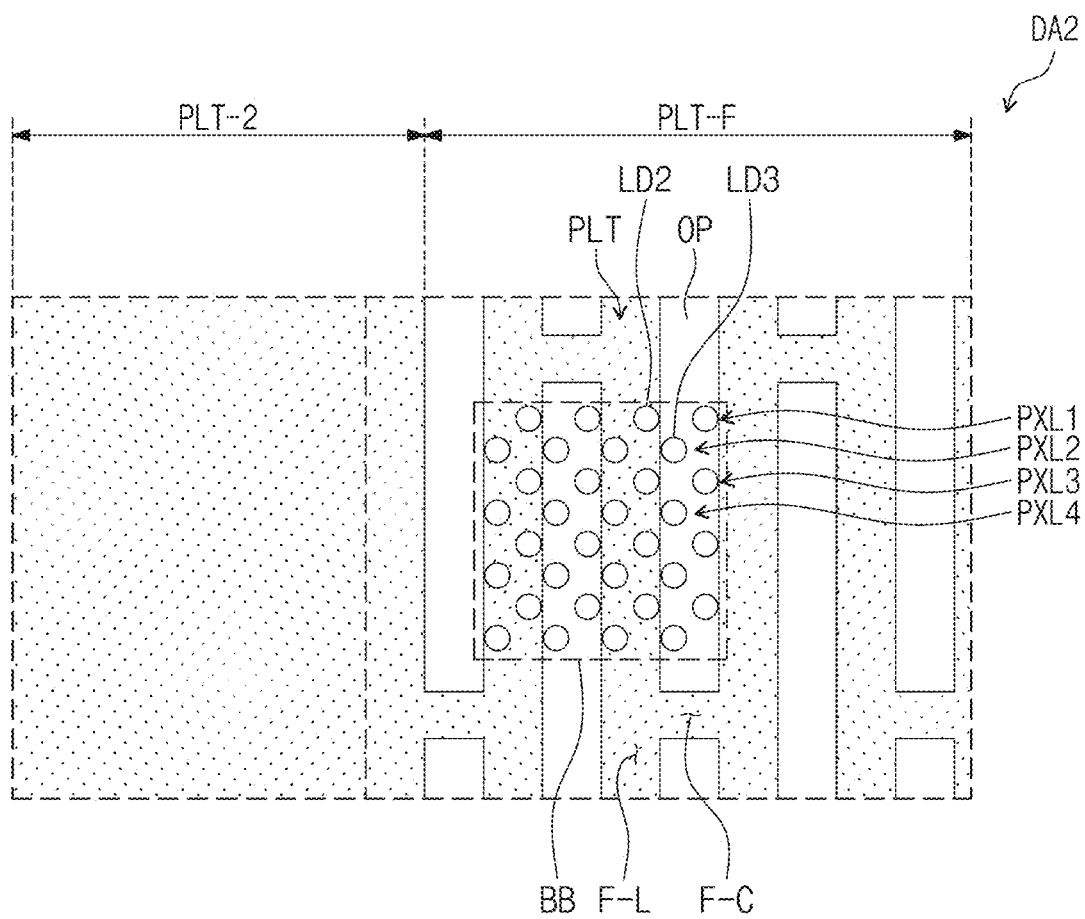
FIG. 7C is a plan view of a second display area overlapping with a support plate.

FIG. 7A is an enlarged plan view of the first display area DA1 according to an embodiment of the present disclosure. FIG. 7A is an enlarged plan view of the portion AA of the first display area DA1 (e.g., see FIG. 3) according to an embodiment of the present disclosure. FIG. 7B is an enlarged plan view of the second display area DA2 according to an embodiment of the present disclosure. FIG. 7B is an enlarged plan view of the portion BB of the second display area DA2 (e.g., see FIG. 3) according to an embodiment of the present disclosure. FIG. 7C is a plan view of the second display area DA2 overlapping with the support plate PLT.

A resolution of a display device may be determined by the number of pixels disposed in a reference area, and may be measured in, for example, pixels per inch (PPI). Typically, the resolution of a light emitting element and the resolution of a pixel circuit are the same as the resolution of a pixel. This is because each of the pixels includes a light emitting element and the pixel circuit that are connected one to one, and the light emitting elements and the pixel circuits are disposed uniformly at (e.g., in or on) the entire display area DP-DA (e.g., see FIG. 3).

Referring to FIGS. 7A and 7B, the first display area DA1 and the second display area DA2 may have different dispositions of the pixels PX. In more detail, the first display area DA1 and the second display area DA2 have the same or substantially the same disposition of the light emitting elements LD as each other, but have different dispositions of the pixel circuits PC from each other. The same disposition of the light emitting elements may mean that an interval between the light emitting elements is the same or substantially the same. In addition, color arrays of the light emitting elements are the same or substantially the same. Hereinafter, embodiments of the present disclosure will be described in more detail with reference to FIGS. 7A and 7B.

Referring to FIG. 7A, first pixels PX1 are disposed at (e.g., in or on) the first display area DA1. The first pixels PX1 are uniformly or substantially uniformly disposed at (e.g., in or on) the first display area DA1. Each of the first pixels PX1 includes a light emitting element LD1 (hereinafter, referred to as a first light emitting element LD1), and a pixel circuit PC1 (hereinafter, referred to as a first pixel circuit PC1) electrically connected to the first light emitting element LD1. The first light emitting element LD1 may include a red light emitting element, a green light emitting element, and a blue light emitting element. The red light emitting element, the green light emitting element, and the blue light emitting element having the same or substantially the same area as each other are illustrated as an example, but the present disclosure is not limited thereto. In addition, FIG. 7A illustrates an anode as a representative of the first light emitting element LD1, or in other words, an anode of the red light emitting element, an anode of the green light emitting element, and an anode of the blue light emitting element. The first pixel circuit PC1 corresponding to the anode may be connected to each other through a contact hole. This will be described in more detail below. The anode is illustrated as circular in the figures, but the shape of the anode is not particularly limited thereto.

Referring to FIG. 7A, two first pixel circuits PC1 are disposed adjacent to each other to provide one circuit group. A plurality of circuit groups are disposed and spaced apart from each other at a suitable interval (e.g., a predetermined or certain interval). However, the disposition of the pixel circuits PC1 shown in FIG. 7A is provided merely as an example, and thus, the present disclosure is not limited thereto. The first pixel circuits PC1 may be disposed and spaced apart from each other in rows of pixels PXL1 to PXL4 at a uniform or substantially uniform interval.

The first pixel circuit PC1 may have the equivalent circuit shown in FIG. 6A. An area shown as the first pixel circuit PC1 in FIG. 7A represents an area occupied by the first to seventh transistors T1 to T7 and the capacitor Cst shown in FIG. 6A. In the drawings, the first pixel circuits PC1 are illustrated as having the same or substantially the same shape as each other, but the present disclosure is not limited thereto. The first pixel circuit PC1 may include a first type pixel circuit and a second type pixel circuit that are paired with each other and repeatedly disposed.

The plurality of pixel rows PXL1 to PXL4 may be defined at (e.g., in or on) the first display area DA1. In each of the first pixel row PXL1 and the third pixel row PXL3, green light emitting elements are arrayed along the second direction DR2, and in the second pixel row PXL2, red light emitting elements and blue light emitting elements are alternately arrayed along the second direction DR2. In the fourth pixel row PXL4, blue light emitting elements and red light emitting elements are alternately arrayed along the second direction DR2.

However, the present disclosure is not limited thereto, and the first pixel row PXL1 and the second pixel row PXL2 may include the same arrays of the light emitting elements as each other. Each of the first pixel row PXL1 and the second pixel row PXL2 may include a plurality of pixel units arrayed in the second direction DR2. Each of the plurality of pixel units may include a red light emitting element, a green light emitting element, or a blue light emitting element arranged along the second direction DR2. Each of the pixel units may further include a fourth color light emitting element configured to generate a colored light different from those generated from the red, green, and blue light emitting elements.

Referring to FIG. 7B, the second display area DA2 includes first partial areas P1 and second partial areas P2. The first partial areas P1 and the second partial areas P2 may be alternately arranged along the second direction DR2. The first partial area P1 may overlap with the first extension part F-C shown in FIG. 5C, and the second partial area P2 may overlap with the opening OP shown in FIG. 5C. In FIG. 7C, light emitting elements LD2 and LD3 of the pixel rows PXL1 to PXL4 are illustrated as overlapping with the support plate PLT. In FIG. 7C, the light emitting elements LD2 and LD3 are illustrated to be in a partial area BB, but in another area, second pixels PX2 and third pixels PX3 may be disposed according to a suitable rule, which will be described in more detail below.

Referring to FIG. 7B, the second pixels PX2 and the third pixels PX3 are disposed at (e.g., in or on) the second display area DA2. Each of the second pixels PX2 includes a light emitting element LD2 (hereinafter, referred to as a second light emitting element LD2), and a pixel circuit PC2 (hereinafter, referred to as a second pixel circuit PC2) electrically connected to the second light emitting element LD2. Each of the third pixels PX3 includes a light emitting element LD3 (hereinafter, referred to as a third light emitting element LD3), and a pixel circuit PC3 (hereinafter, referred to as a third pixel circuit PC3) electrically connected to the third light emitting element LD3.

The second pixel circuits PC2 and the third pixel circuits PC3 are arrayed according to a different rule from that of the first pixel circuits PC1. The resolution of the pixel circuits PC1 in the first display area DA1 may be different from those of the pixel circuits PC2 and PC3 in the second display area DA2. In more detail, the resolution of the first pixel circuits PC1 in the first display area DA1 may be different from that of the pixel circuits in the first partial area P1 and that of the pixel circuits in the second partial area P2. The resolution of the pixel circuits in the first partial area P1 may be different from that of the pixel circuits in the second partial area P2.

Referring to FIGS. 7A and 7B, the resolutions of the pixels PX in the first display area DA1 and the second display area DA2 are the same or substantially the same as each other, and the resolutions of the light emitting elements in the first display area DA1 and the second display area DA2 are the same or substantially the same as each other. The resolution of the pixel circuits in the first partial area P1 is higher than that of the pixel circuits in the first display area DA1. In other words, the pixel circuits at (e.g., in or on) the first display area DA1 are less densely disposed than those at (e.g., in or on) the first partial area P1.

As shown in FIG. 7B, the second pixel circuits PC2 and the third pixel circuits PC3 may be disposed at (e.g., in or on) the first partial area P1. The second light emitting elements LD2 may overlap with the second pixel circuits PC2, but the third light emitting elements LD3 may not overlap with the third pixel circuits PC3. Pixel circuits may not be disposed at (e.g., in or on) the second partial area P2. The second partial area P2 overlapping with the openings OP of FIG. 5C has low impact resistance, and thus, short-circuit or disconnection in the circuits may occur due to an external impact. Referring to FIG. 7B, a fault in the pixel circuit may be reduced by minimizing or substantially minimizing the pixel circuits disposed at (e.g., in or on) the second partial area P2.

Referring to FIGS. 7A and 7B, the resolution of the pixel circuits PC2 and PC3 at (e.g., in or on) the first partial area P1 is higher in comparison with the resolution of the pixel circuits PC1 at (e.g., in or on) the first display area DA1. However, the area occupied by a single first pixel circuit PC1, the area occupied by a single second pixel circuit PC2, and the area occupied by a single third pixel circuit PC3 may be the same or substantially the same as each other. That the areas of the pixel circuits are the same or substantially the same as each other means that the layouts of the pixel circuits are the same or substantially the same as each other, and the sizes and array rules of the transistors providing the pixel circuits are the same or substantially the same as each other. The first pixel circuit PC1, the second pixel circuit PC2, and the third pixel circuit PC3 have the same or substantially the same areas as each other, and thus, uniform or substantially uniform circuits may be designed. Noise factors, such as peripheral signals or parasitic capacitances, which may influence the operations of the first pixel circuit PC1, the second pixel circuit PC2, and the third pixel circuit PC3, may be the same or substantially the same, and thus, the pixel circuits may be easily controlled.

Referring to FIGS. 7A and 7B, when the design of the display panel DP satisfies Equation (1) below, the third pixel circuit PC3 of the display panel DP may be disposed at (e.g., in or on) the first partial area P1.

$$W1/Z \geq (W1+W2)/H \qquad \text{Equation (1):}$$

In Equation (1), a width of the first partial area P1 is defined as W1, a width of the second partial area P2 is defined as W2, a standard width of the first pixel circuit PC1, which is calculated on the basis of the resolution of the pixel circuits of the first display area DA1, is defined as H, and a standard width of the second pixel circuit PC2 or the third pixel circuit PC3, which is calculated on the basis of the resolution of the pixel circuits of the first partial area P1, is defined as Z. The standard widths of the second pixel circuit PC2 and the third pixel circuit PC3 are assumed to be same or substantially the same as each other.

Here, "a standard width of the first pixel circuit PC1" means a maximum width in which the first pixel circuit PC1 may be disposed under a condition that the resolution of the first pixel circuit PC1 is satisfied. Similarly, "a standard width of the second pixel circuit PC2 or the third pixel circuit PC3" means a maximum width in which the second pixel circuit PC2 and the third pixel circuit PC3 are disposed under a condition that the resolutions of the second pixel circuit PC2 and the third pixel circuit PC3 are satisfied.

The standard width of the first pixel circuit PC1 may be different from an actual measurement width of the first pixel circuit PC1, and the standard width of the second pixel circuit PC2 may be different from an actual measurement width of the second pixel circuit PC2. For example, when the resolution of the pixel circuits of the first display area DA1 is about 320 PPI, the standard width H of the first pixel circuit PC1 is about 78 µm. When the resolution of the pixel circuits of the first partial area P1 is about 500 PPI, the standard width Z of the second pixel circuit PC2 is about 50 µm. However, the actual measurement width of the first pixel circuit PC1 may be designed to be smaller than about 78 µm, and an actual measurement width of the third pixel circuit PC3 may be smaller than about 50 µm. Referring to FIG. 7A, it may be understood that the first pixel circuit PC1 is designed to have an actual measurement width smaller than the standard width H. Referring to FIG. 7B, it may be understood that the second pixel circuit PC2 and the third pixel circuit PC3 are designed to have the same or substantially the same actual measurement width as the standard width Z.

In FIG. 7B, an area of the second display area DA2, which overlaps with the second extension part F-L shown FIG. 5O, is not shown. The area of the second display area DA2 that overlaps with the second extension part F-L shown in FIG. 5C may have the same or substantially the same pixel structure as that of the first partial area P1, the same or substantially the same pixel structure as that of the second partial area P2, or the same or substantially the same pixel structure as that of the first display area DA1 shown in FIG. 7A, but is not particularly limited thereto.

When the area overlapping with the second extension part F-L shown in FIG. 5C has the same or substantially the same pixel structure as that of the first partial area P1, the third pixel circuit PC3 disposed in the area overlapping with the second extension part F-L may also be electrically connected to the third light emitting element LD3 disposed at (e.g., in or on) the second partial area P2. When the area overlapping with the second extension part F-L has the same or substantially the same pixel structure as that of the second partial area P2, the third pixel circuit LD3 disposed in the area at (e.g., in or on) the second display area DA2, which overlaps with the second extension part F-L, may also be electrically connected to the third pixel circuit PC3 disposed at (e.g., in or on) the first partial area P1.

Figure 8A:
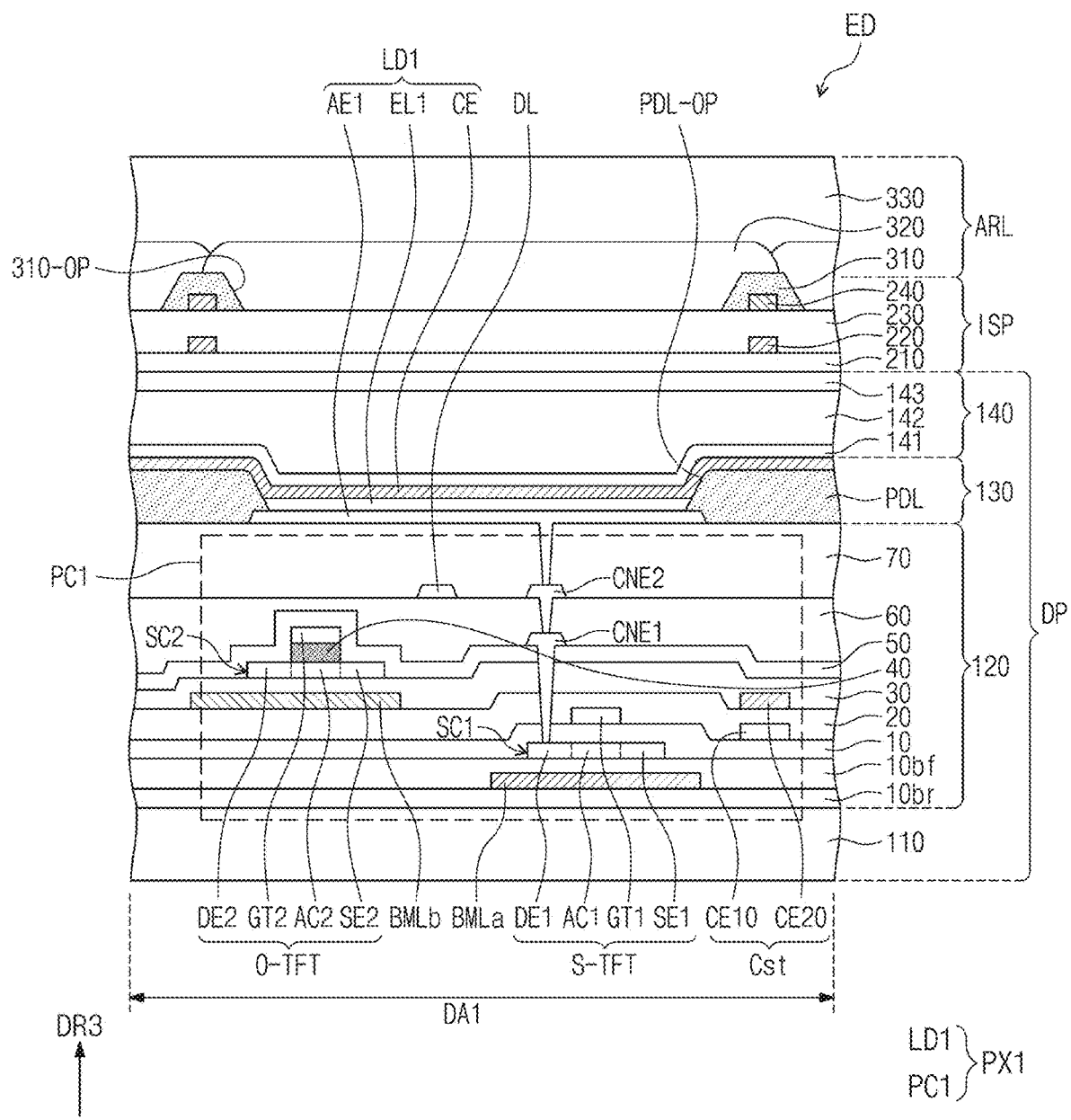
FIG. 8A is a cross-sectional view of a first display area according to an embodiment of the present disclosure.
Figure 8B:
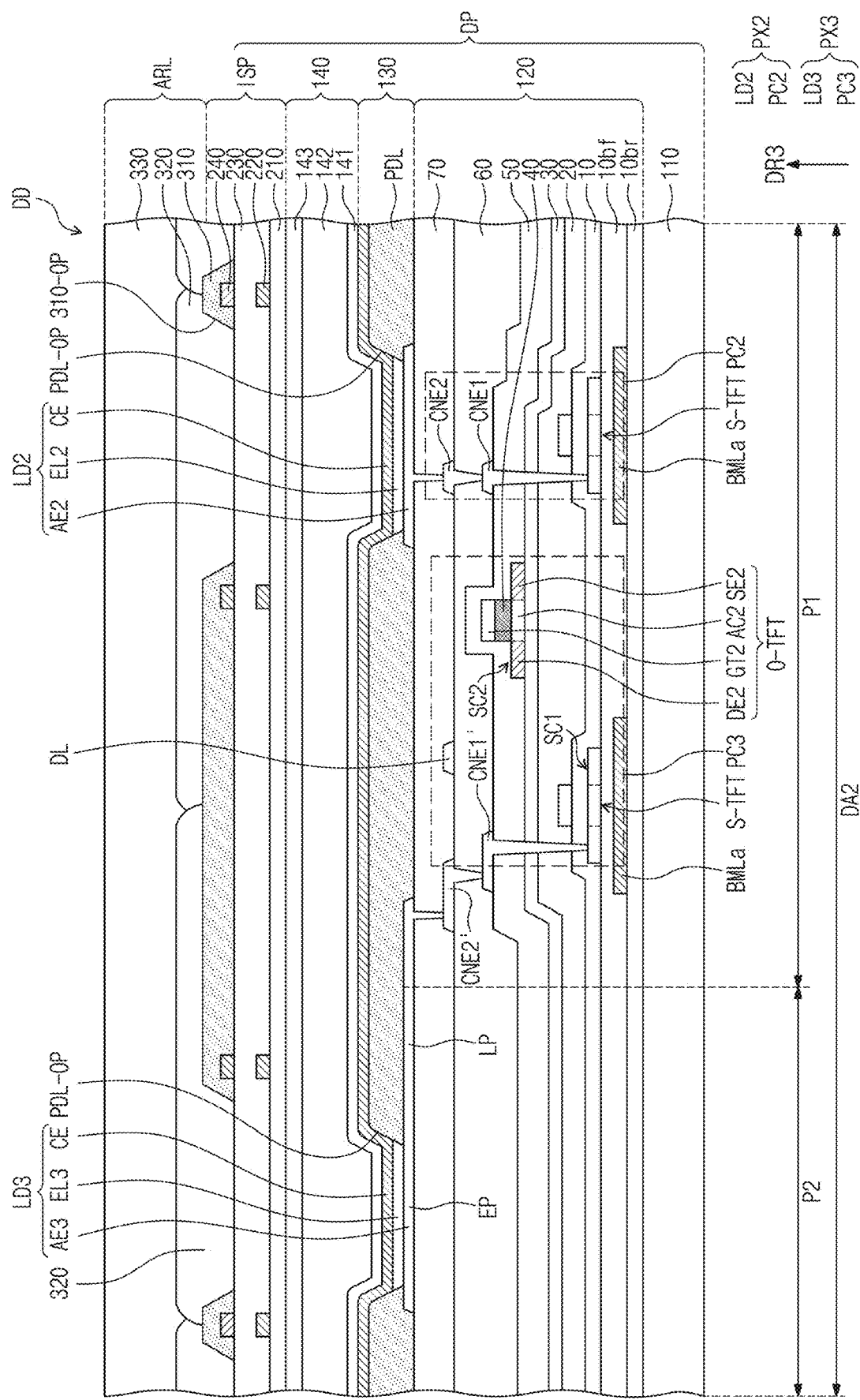
FIGS. 8B and 8C are cross-sectional views of a second display area according to one or more embodiments of the present disclosure.
Figure 8C:
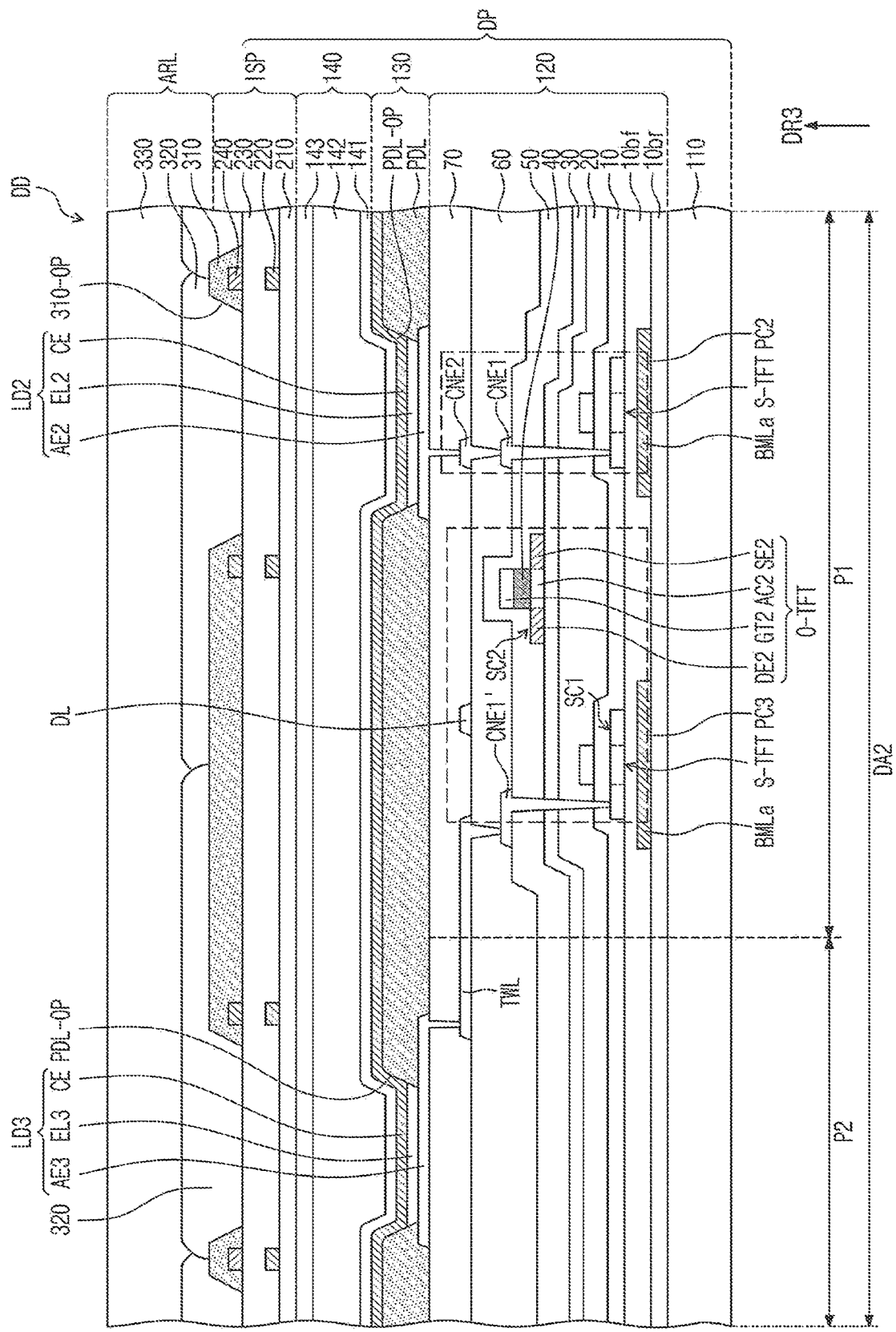

FIG. 8A is a cross-sectional view of the first display area DA1 according to an embodiment of the present disclosure. FIGS. 8B and 8C are cross-sectional views of the second display area DA2 according to one or more embodiments of the present disclosure.

In FIG. 8A, a silicon transistor S-TFT and an oxide transistor O-TFT of the first pixel circuit PC1, and the first light emitting element LD1 are illustrated. In the equivalent circuit shown in FIG. 6A, the third and fourth transistors T3 and T4 may be oxide transistors O-TFT, and the other remaining transistors may be silicon transistors S-TFT. In FIG. 8B and FIG. 8C, a portion of the second light emitting element LD2 and the second pixel circuit PC2, and a portion of the third light emitting element LD3 and the third pixel circuit PC3 are illustrated. The silicon transistor S-TFT shown in FIG. 8B may be the sixth transistor T6 shown in FIG. 6A.

Referring to FIG. 8A, a barrier layer 10*br* may be disposed on the base layer 110. The barrier layer 10*br* prevents or substantially prevents foreign matter from entering from the outside. The barrier layer 10*br* may include at least one inorganic layer. The barrier layer 10*br* may include a silicon oxide layer and a silicon nitride layer. Each of the silicon oxide layer and the silicon nitride layer may be provided in a plurality, and the silicon oxide layers and the silicon nitride layers may be alternately laminated.

A first shield electrode BMLa may be disposed on the barrier layer 10*br*. The first shield electrode BMLa may include a metal. The first shield electrode BMLa may include molybdenum (Mo) having a good thermal resistance, an alloy containing molybdenum, titanium (Ti), or an alloy containing titanium. The first shield electrode BMLa may receive a bias voltage. The first shield electrode BMLa may also receive the first power supply voltage ELVDD. The first shield electrode BMLa may shield an electric potential caused by a polarization phenomenon from influencing the silicon transistor S-TFT. The first shield electrode BMLa may shield external light from reaching the silicon transistor S-TFT. In an embodiment of the present disclosure, the first shield electrode BMLa may be a floating electrode that is electrically isolated from another electrode or wiring.

A buffer layer 10*bf* may be disposed on the barrier layer 10*br*. The buffer layer 10*bf* may prevent or substantially prevent a phenomenon in which metal atoms or impurities diffuse to a first semiconductor pattern SC1. The buffer layer 10*bf* may include at least one inorganic layer. The buffer layer 10*bf* may include a silicon oxide layer and/or a silicon nitride layer.

The first semiconductor pattern SC1 may be disposed on the buffer layer 10*bf*. The first semiconductor pattern SC1 may include a silicon semiconductor. For example, the silicon semiconductor may include amorphous silicon, polycrystalline, or the like. For example, the first semiconductor pattern SC1 may include low temperature polysilicon.

FIG. 8A illustrates only a portion of the first semiconductor pattern SC1, and the first semiconductor pattern SC1 may be further disposed at (e.g., in or on) another area. The first semiconductor pattern SC1 may be arrayed in a suitable rule (e.g., a predetermined or specific rule) across the pixels PX. The first semiconductor pattern SC1 may have different electrical properties according to whether or not it is doped. The first semiconductor pattern SC1 may include a first area having a high conductivity, and a second area having a low conductivity. The first area may be doped with an N-type dopant or a P-type dopant. A P-type transistor includes a doping area doped with a P-type dopant, and an N-type transistor includes a doping area doped with an N-type dopant. The second area may be a non-doping area, or may be doped at a lower concentration relative to the first area.

The first area may have a higher conductivity than the second area, and may serve or substantially serve as an electrode or a signal line. The second area may correspond to or substantially correspond to a channel area (e.g., an active area) of the transistor. In other words, a portion of the first semiconductor pattern SC1 may be a channel of the transistor, another portion may be the source or drain of the transistor, and still another portion may be a connection electrode or a signal connection line.

A source area SE1, a channel area AC1 (e.g., an active area), and a drain area DE1 of the silicon transistor S-TFT may be provided from the first semiconductor pattern SC1.

In a cross-sectional view, the source area SE1 and the drain area DE1 may extend from the channel area AC1 in opposite directions from each other.

The first insulation layer 10 may be disposed on the buffer layer 10*bf*. The first insulation layer 10 may cover the first semiconductor pattern SC1. The first insulation layer 10 may be an inorganic layer. The first insulation layer 10 may be a silicon oxide layer of a single layer. The first insulation layer 10 may also have a multi-layered structure. The inorganic layer of the circuit layer 120 described in more detail below may have a single layer structure or a multi-layered structure, and may include at least one of the foregoing materials, but the present disclosure is not limited thereto.

A gate GT1 of the silicon transistor S-TFT is disposed on the first insulation layer 10. The gate GT1 may be a portion of a metal pattern. The gate GT1 overlaps with the channel area AC1. The gate GT1 may be used as a mask in a process for doping the first semiconductor pattern SC1. A first electrode CE10 of the storage capacitor Cst is disposed on the first insulation layer 10. Unlike the example shown in FIG. 8A, the first electrode CE10 may have an integrated shape with the gate GT1.

The second insulation layer 20 may be disposed on the first insulation layer 10, and may cover the gate GT1. Although not shown in the drawing, a top electrode, which overlaps with the gate GT1, may be disposed on the second insulation layer 20. A second electrode CE20, which overlaps with the first electrode CE10, may be disposed on the second insulation layer 20.

A second shield electrode BMLb is disposed on the second insulation layer 20. The second shield electrode BMLb may be disposed corresponding to a bottom of the oxide transistor O-TFT. In an embodiment of the present disclosure, the second shield electrode BMLb may be omitted as needed or desired. According to an embodiment of the present disclosure, the first shield electrode BMLa may extend to the bottom of the oxide transistor O-TFT to replace the second shield electrode BMLb.

A third insulation layer 30 may be disposed on the second insulation layer 20. A second semiconductor pattern SC2 may be disposed on the third insulation layer 30. The second semiconductor pattern SC2 may include a channel area AC2 of the oxide transistor O-TFT. The second semiconductor pattern SC2 may include an oxide semiconductor. The second semiconductor pattern SC2 may include a transparent conductive oxide (TCO), such as indium tin oxide (ITO), indium zinc oxide (IZO), indium-gallium-zinc oxide (IGZO), zinc oxide (ZnOx), or indium oxide (In2O3).

The oxide semiconductor may include a plurality of zones divided according to whether or not a TCO is reduced. A zone (hereinafter, referred to as a reduction zone) in which the TCO is reduced has a higher conductivity in comparison to a zone (hereinafter, referred to as a non-reduction zone) in which the TCO is not reduced. The reduction zone may serve or substantially serve as a source/drain or a signal line of the transistor. The non-reduction zone corresponds to or substantially corresponds to a semiconductor area (e.g., a channel) of the transistor. In other words, a portion of the second semiconductor pattern SC2 may be a semiconductor area of the transistor, another portion may be a source/drain of the transistor, and still another portion may be a signal transfer area.

A fourth insulation layer 40 may be disposed on the third insulation layer 30. As shown in FIG. 8A, the fourth insulation layer 40 may be an insulation pattern that overlaps with the gate GT2 of the oxide transistor O-TFT, while exposing the source area SE2 and the drain area DE2 of the oxide transistor O-TFT. In an embodiment of the present disclosure, the fourth insulation layer 40 may commonly overlap with the plurality of pixels, and may cover the second semiconductor pattern SC2.

The gate GT2 of the oxide transistor O-TFT is disposed on the fourth insulation layer 40. The gate GT2 of the oxide transistor O-TFT may be a portion of a metal pattern. The gate GT2 of the oxide transistor O-TFT may overlap with the channel area AC2.

A fifth insulation layer 50 may be disposed on the fourth insulation layer 40, and the fifth insulation layer 50 may cover the gate GT2. Each of the first to fifth insulation layers 10 to 50 may be an inorganic layer.

A first connection electrode CNE1 may be disposed on the fifth insulation layer 50. The first connection electrode CNE1 may be connected to the drain area DE1 of the silicon transistor S-TFT through a contact hole penetrating through the first insulation layer 10, the second insulation layer 20, the third insulation layer 30, and the fifth insulation layer 50.

A sixth insulation layer 60 may be disposed on the fifth insulation layer 50. A second connection electrode CNE2 may be disposed on the sixth insulation layer 60. The second connection electrode CNE2 may be connected to the first connection electrode CNE1 through a contact hole penetrating through the sixth insulation layer 60. A data line DL may be disposed on the sixth insulation layer 60. A seventh insulation layer 70 may be disposed on the sixth insulation layer 60, and may cover the second connection electrode CNE2 and the data line DL. Each of the sixth and seventh insulation layers 60 and 70 may be an organic layer.

The first light emitting element LD1 may include an anode AE1 (e.g., a first electrode), a light emitting layer EML1, and a cathode CE (e.g., a second electrode). The cathodes CE of the second and third light emitting elements LD2 and LD3 described in more detail below may have a shape integrated with the cathode CE of the first light emitting element LD1. In other words, the cathode CE may be commonly provided to the first to third light emitting elements LD1, LD2, and LD3.

The anode AE1 of the first light emitting element LD1 may be disposed on the seventh insulation layer 70. The anode AE1 may be a (semi-) transparent electrode or a reflective electrode. A pixel definition layer PDL may be disposed on the seventh insulation layer 70. The pixel definition layer PDL may have a light absorption property, and for example, may have a black color. The pixel definition layer PDL may include a black coloring agent. The black coloring agent may include a black dye or a black pigment. The black coloring agent may include carbon black, a metal such as chromium, or an oxide thereof. The pixel definition layer PDL may correspond to a light shielding pattern having a light shielding property.

The pixel definition layer PDL may cover a portion of the anode AE1. For example, an opening PDL-OP exposing a portion of the anode AE1 may be defined in the pixel definition layer PDL.

In some embodiments, a hole control layer may be disposed between the anode AE1 and the light emitting layer EML1. The hole control layer may include a hole transport layer, and may further include a hole injection layer. An electron control layer may be disposed between the light emitting layer EML1 and the cathode CE. The electron control layer may include an electron transport layer, and may further include an electron injection layer. The hole control layer and the electron control layer may be commonly provided in the plurality of pixels PX (e.g., see FIG. 3) using an open mask.

The encapsulation layer 140 may be disposed on the light-emitting element layer 130. The encapsulation layer 140 may include an inorganic layer 141, an organic layer 142, and an inorganic layer 143, which are successively laminated, but the layers providing the encapsulation layer 140 are not limited thereto.

The inorganic layers 141 and 143 may protect the light emitting element layer 130 from moisture and/or oxygen, and the organic layer 142 may protect the light emitting element layer 130 from foreign matter, such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylic-based organic layer, but the present disclosure is not limited thereto.

The input sensor ISP may be disposed on the display panel DP. The input sensor ISP may include at least one conductive layer, and at least one insulation layer. In the present embodiment, the input sensor ISP may include a first insulation layer 210, a first conductive layer 220, a second insulation layer 230, and a second conductive layer 240.

The first insulation layer 210 may be directly disposed on the display panel DP. The first insulation layer 210 may be an inorganic layer including any one of silicon nitride, silicon oxynitride, or silicon oxide. Each of the first conductive layer 220 and the second conductive layer 240 may have a single layer structure or a multi-layered structure laminated along the third direction DR3. Each of the first conductive layer 220 and the second conductive layer 240 may include conductive lines defining an electrode of a mesh shape. The conductive lines of the first conductive layer 220 and the conductive lines of the second conductive layer 240 may or may not be connected through a contact hole penetrating the second insulation layer 230. According to the type of a sensor providing the input sensor ISP, a connection relationship may be determined between the conductive lines of the first conductive layer 220 and the conductive lines of the second conductive layer 240.

Each of the first conductive layer 220 and the second conductive layer 240 of single layer structures may include a metal layer or a transparent conductive layer. The metal layer may include molybdenum, silver, titanium, copper, aluminum, or an alloy thereof. The transparent conductive layer may include a TCO, such as indium tin oxide (ITO), indium zinc oxide (IZO), zinc oxide (ZnOx), or indium-zinc-tin oxide (IZTO). As another example, the transparent conductive layer may include a conductive polymer, such as PEDOT, a metal nano-wire, or graphene.

Each of the first conductive layer 220 and the second conductive layer 240 of multi-layered structures may include a plurality of metal layers. For example, the layers may have a three-layered structure of titanium/aluminum/titanium. The conductive layer of the multi-layered structure may include at least one metal layer, and at least one transparent conductive layer. The second insulation layer 230 may be disposed between the first conductive layer 220 and the second conductive layer 240.

The anti-reflection layer ARL may be disposed on the input sensor ISP. The anti-reflection layer ARL may include a division layer 310, a color filter 320, and a planarization layer 330.

A material defining the division layer 310 may be used without particular limitation, so long as the material absorbs light. The division layer 310 is a layer having a black color, and in an embodiment, may include a black coloring agent. The black coloring agent may include a black dye or a black pigment. The black coloring agent may include carbon black, a metal such as chromium, or an oxide thereof.

The division layer 310 may cover the second conductive layer 240 of the input sensor ISP. The division layer 310 may prevent or substantially prevent reflection of external light caused by the second conductive layer 240. An opening 310-OP may be defined in the division layer 310. The opening 310-OP may overlap with the anode AE1. The color filter 320 may overlap with the opening 310-OP. The color filter 320 may contact the division layer 310.

The planarization layer 330 may cover the division layer 310 and the color filter 320. The planarization layer 330 may include an organic material, and may provide a planar or substantially planar surface at (e.g., in or on) a top surface of the planarization layer 330. In an embodiment of the present disclosure, the planarization layer 330 may be omitted as needed or desired.

In FIG. 8B, the oxide transistor O-TFT of the second pixel circuit PC2 is not shown, unlike those shown of the first pixel circuit PC1 and the third pixel circuit PC3. With reference to FIG. 8B, redundant description of the second pixel PX2 and the third pixel PX3 that is the same or substantially the same as that of the first pixel PX1 described above with reference to FIG. 8A may not be repeated.

Referring to FIG. 8B, the anode AE3 of the third light emitting element LD3 disposed at (e.g., in or on) the second partial area P2 may be electrically connected to the third pixel circuit PC3 disposed at (e.g., in or on) the first partial area P1. The anode AE3 of the third light emitting element LD3 may be electrically connected to the silicon transistor S-TFT or the oxide transistor O-TFT. In FIG. 8B, the anode AE3 of the third light emitting element LD3 is illustrated as being connected to the silicon transistor S-TFT.

A line part LP of the anode AE3 of the third light emitting element LD3 may extend from an electrode part EP overlapping with the opening PDL-OP. The line part LP may be electrically connected with the third pixel circuit PC3 through connection electrodes CNE1' and CNE2'.

Referring to FIG. 8C, a connection line TWL connecting the anode AE3 of the third light emitting element LD3 and the third pixel circuit PC3 to each other may be further disposed. The connection line TWL may be disposed at (e.g., in or on) a different layer from that of the anode AE3. As shown in FIG. 8O, the connection line TWL may be disposed between the sixth insulation layer 60 and the seventh insulation layer 70. The connection line TWL may be connected to the anode AE3 and the first connection electrode CNE1' through contact holes. The disposition of the connection line TWL may address an issue of short-circuiting with an anode of another light emitting element. This will be described in more detail below with reference to FIG. 10.

Figure 9A:
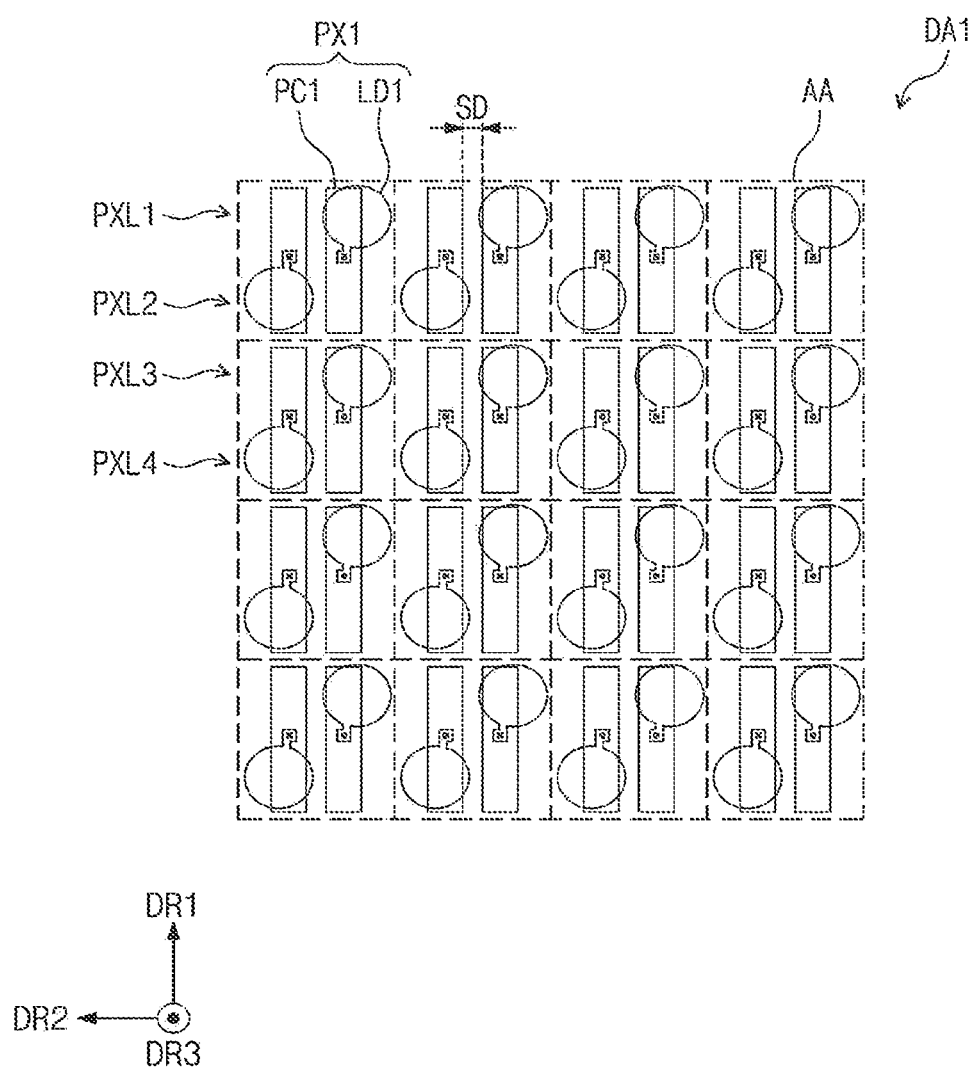
FIGS. 9A and 9B are enlarged plan views of a first display area according to one or more embodiments of the present disclosure.
Figure 9B:
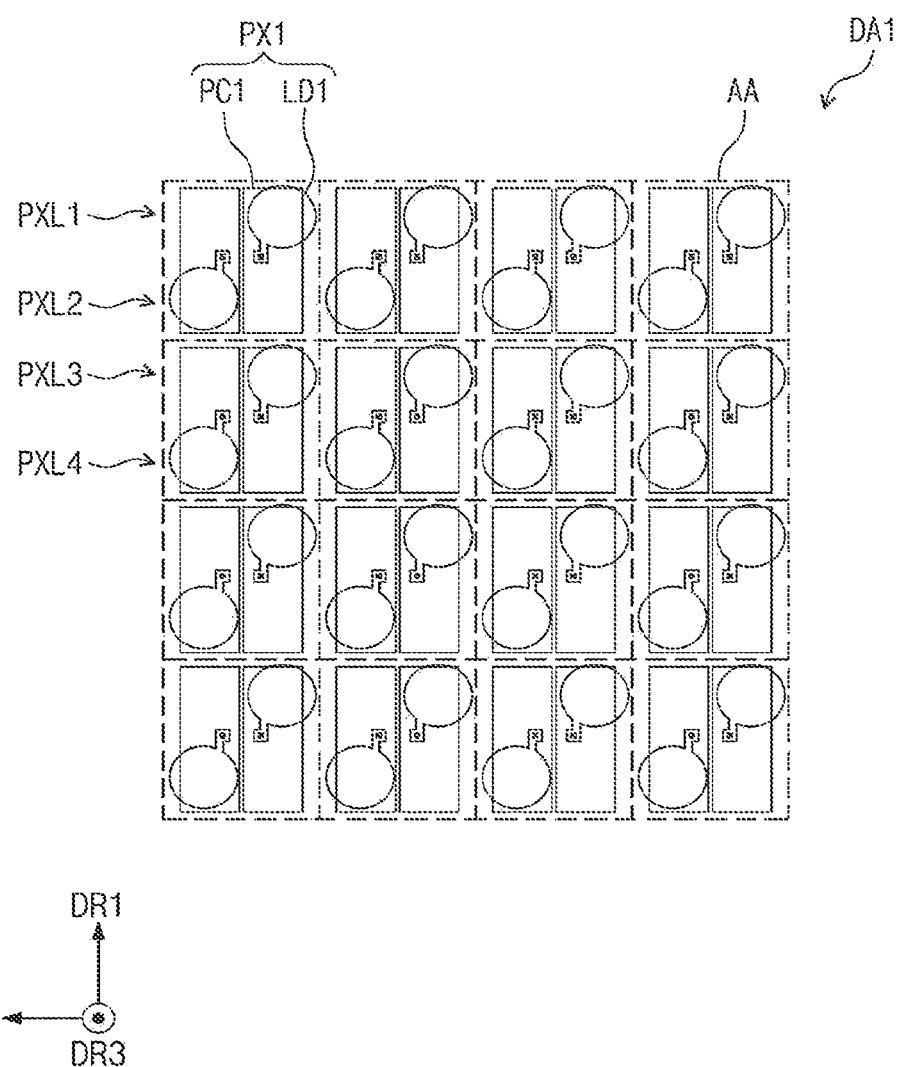
Figure 9C:
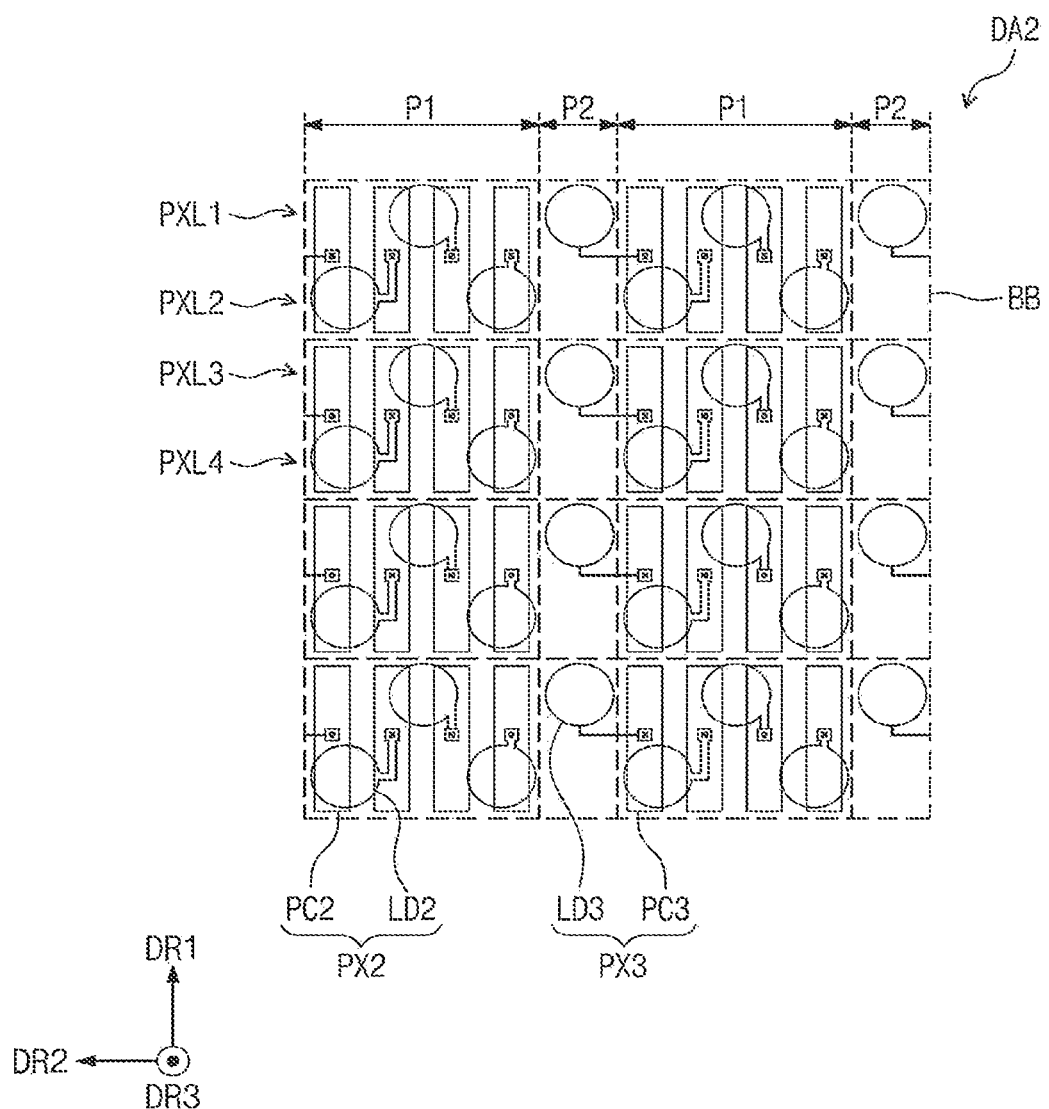
FIGS. 9C and 9D are enlarged plan views of a second display area according to one or more embodiments of the present disclosure.
Figure 9D:
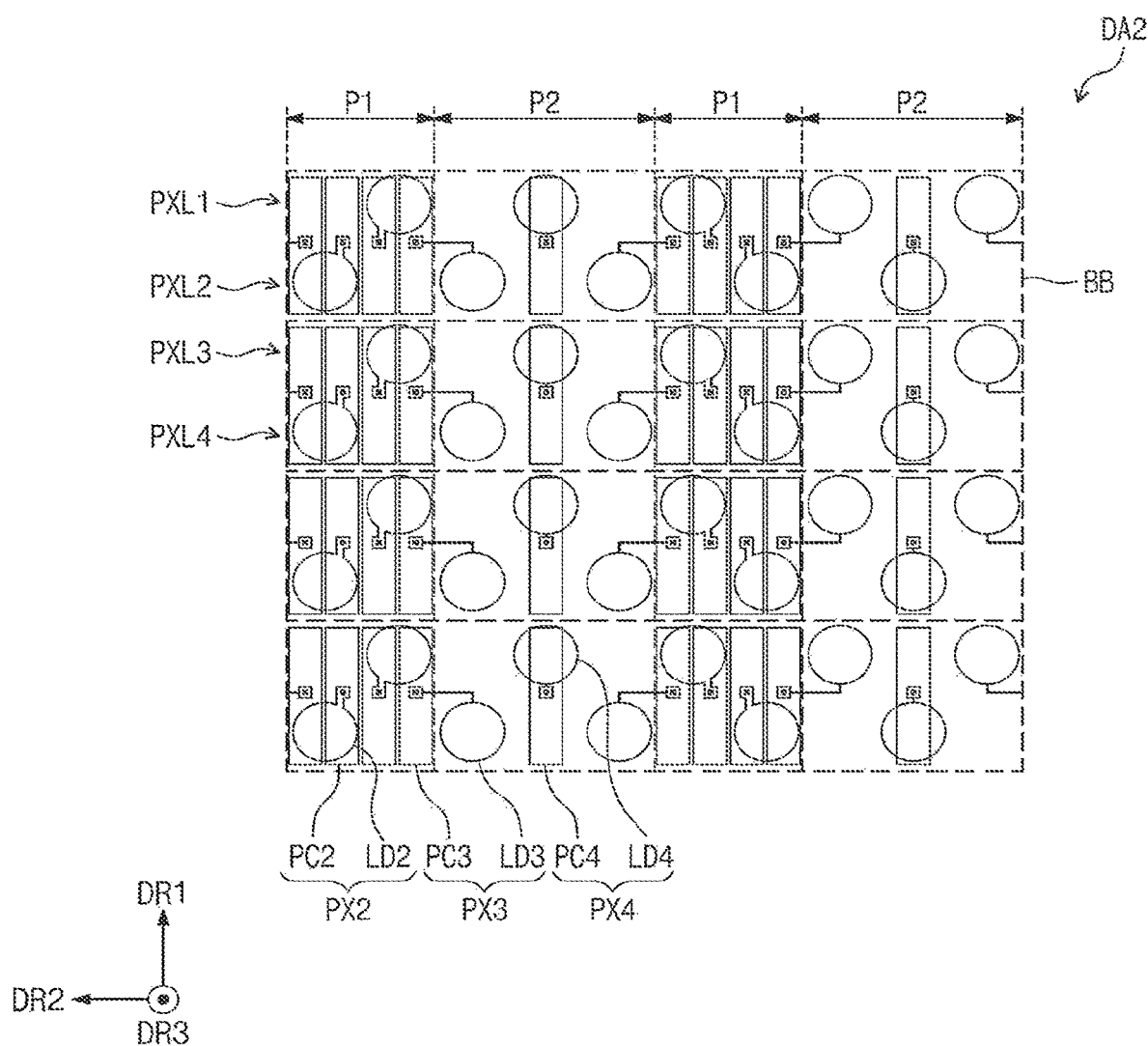

FIGS. 9A and 9B are enlarged plan views of the first display area DA1 according to embodiments of the present disclosure. FIGS. 9C and 9D are enlarged plan views of the second display area DA2 according to embodiments of the present disclosure.

Referring to FIG. 9A, it may be understood that an interval SD between first pixel circuits PC1 disposed adjacent to each other are increased compared to that of the first pixel circuits PC1 shown in FIG. 7A. The interval SD of the first pixel circuits PC1 may be larger than that between the second and third pixel circuits PC2 and PC3 shown in FIG. 7B. By increasing the interval SD of the first pixel circuits PC1, interference between the first pixel circuits PC1 may be reduced.

Referring to FIG. 9B, it may be understood that the area of the first pixel circuits PC1 are increased compared to that of the first pixel circuits PC1 shown in FIG. 7A. As the area of the first pixel circuits PC1 increases, the transistors T1 to T7 (e.g., see FIG. 6A) may be freely designed. Interference between the transistors T1 to T7 may be reduced by designing the transistors T1 to T7 in a wider area.

In the second display area DA2 shown in FIGS. 7B and 9C, it may be understood that, when the sum of the widths of the first partial area P1 and the second partial area P2 is assumed to be constant or substantially constant, a ratio of the width of the first partial area P1 over the sum in the second display area DA2 shown in FIG. 9C increases when compared to that of the second display area DA2 shown in FIG. 7B. As the area in which the second and third pixel circuits PC2 and PC3 are disposed increases, the interval between adjacent pixel circuits from among the second pixel circuits PC2 and the third pixel circuits PC3 may increase. Accordingly, interference between the adjacent pixel circuits may be reduced.

It may be understood that the width of the second partial area P2 in the second display area DA2 shown in FIG. 9D is increased compared to that of the second display area DA2 shown in FIG. 7B. The width of the second partial area P2 may be larger than that of the first partial area P1.

According to an embodiment of the present disclosure, the second display area DA2 may further include a fourth pixel PX4 including a fourth pixel circuit PC4 disposed at (e.g., in or on) the second partial area P2, and a fourth light emitting element LD4 disposed at (e.g., in or on) the second partial area P2 and connected to the fourth pixel circuit PC4. Even when the fourth pixel circuit PC4 is disposed at (e.g., in or on) the second partial area P2, the resolution of the pixel circuits in the second partial area P2 is lower than those of the pixel circuits in the first display area DA1 and the pixel circuits in the first partial area P1. The resolution of the pixel circuits in the second partial area P2 is lowered to reduce disconnection or short-circuit of the pixel circuits that may occur in the second partial area P2.

Figure 10:
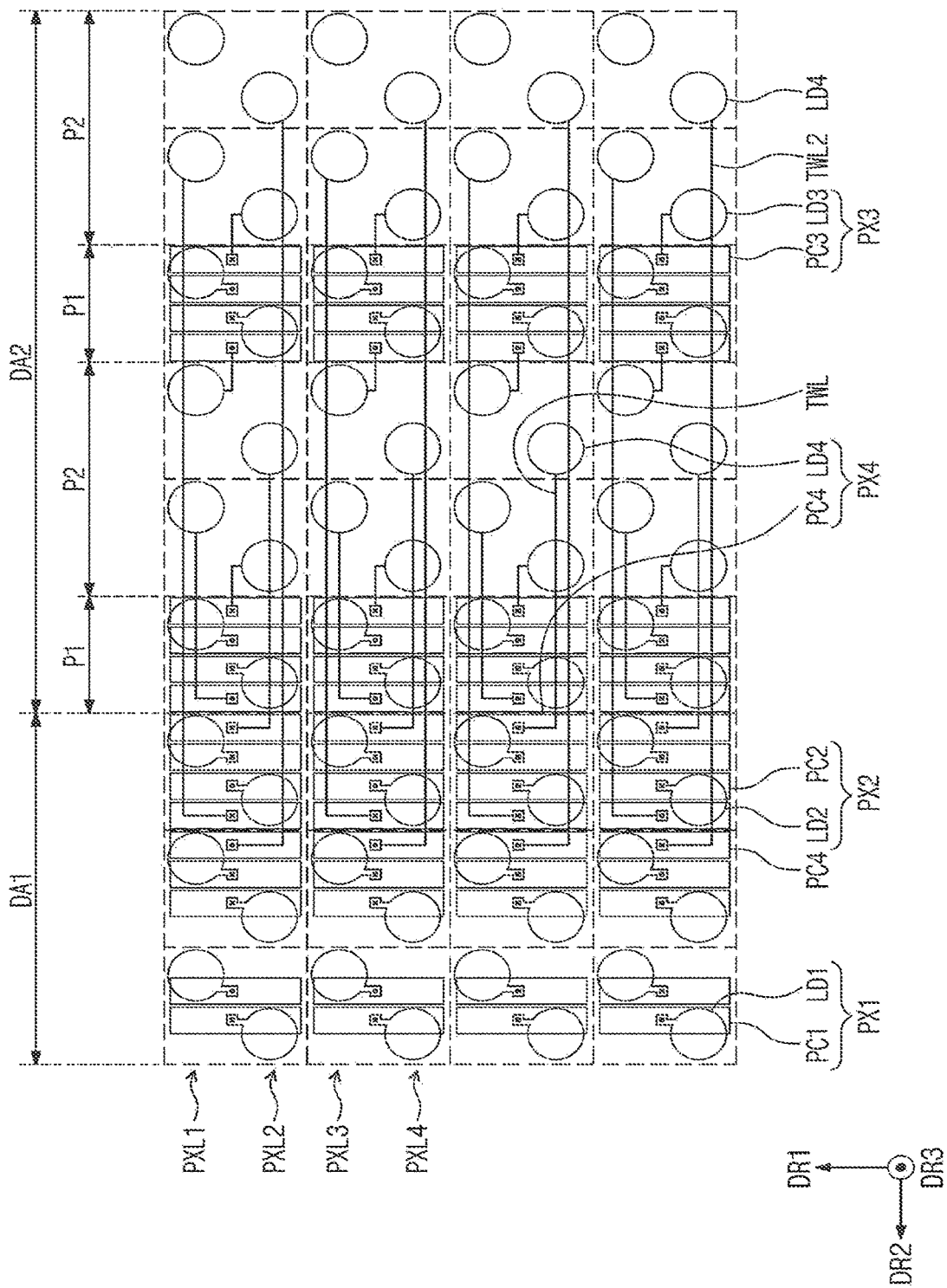
FIG. 10 is an enlarged plan view of first and second display areas according to an embodiment of the present disclosure.

FIG. 10 is an enlarged plan view of the first and second display areas DA1 and DA2 according to an embodiment of the present disclosure.

According to an embodiment, the display panel DP (e.g., see FIG. 3) further includes the fourth pixel PX4 including the fourth pixel circuit PC4 disposed at (e.g., in or on) the first display area DA1, and the fourth light emitting element LD4 disposed at (e.g., in or on) the second partial area P2 of the second display area DA2. It may be understood that the resolution of the pixel circuits at (e.g., in or on) the first partial area P1 excessively increases in comparison to that in the first display area DA1 by disposing the fourth pixel circuit PC4 at (e.g., in or on) the first display area DA1. The fourth light emitting elements LD4 may be disposed in some of or all of the plurality of second partial areas P2.

A connection line TWL, which electrically connects the fourth pixel circuit PC4 and the fourth light emitting element LD4 to each other, may be the same or substantially the same as the connection line TWL described above with reference to FIG. 8C. The connection line TWL may overlap with the light emitting elements disposed at (e.g., in or on) an upper side.

When the design of the display panel DP satisfies the following Equation (2), the display panel DP may further include the fourth pixel PX4 shown in FIG. 10.

$$W1/Z < (W1+W2)/H \quad \text{Equation (2):}$$

When the width (or area) of the first partial area P1 is not sufficient in comparison to the increase in the resolution of the pixel circuits in the first partial area P1, the third pixel circuit PC3 may not be disposed at (e.g., in or on) the first partial area P1, and the fourth pixel circuit PC4 may be disposed at (e.g., in or on) the first display area DA1. The third pixel PX3 and the fourth pixel PX4 are identified according to the positions of the pixel circuits. When the embodiment shown in FIG. 7B is compared with the embodiment shown in FIG. 10, a ratio of the number of the third pixels PX3 and the number of the fourth pixels PX4 may be determined in consideration of the resolution of the pixel circuits in the first partial area P1 and the width (or area) of the first partial area P1.

On the other hand, referring to FIG. 10, it may be understood that the third pixel circuit PC3 disposed at (e.g., in or on) the first partial area P1, which is most adjacent to the first display area DA1, is connected with the third light emitting element LD3 through the connection line TWL. The connection relationship between the third pixel circuit PC3 and the third light emitting element LD3 may be provided in various suitable types, for example, as those shown in FIGS. 8B and 8C, but is not limited to a particular structure.

Figure 11A:
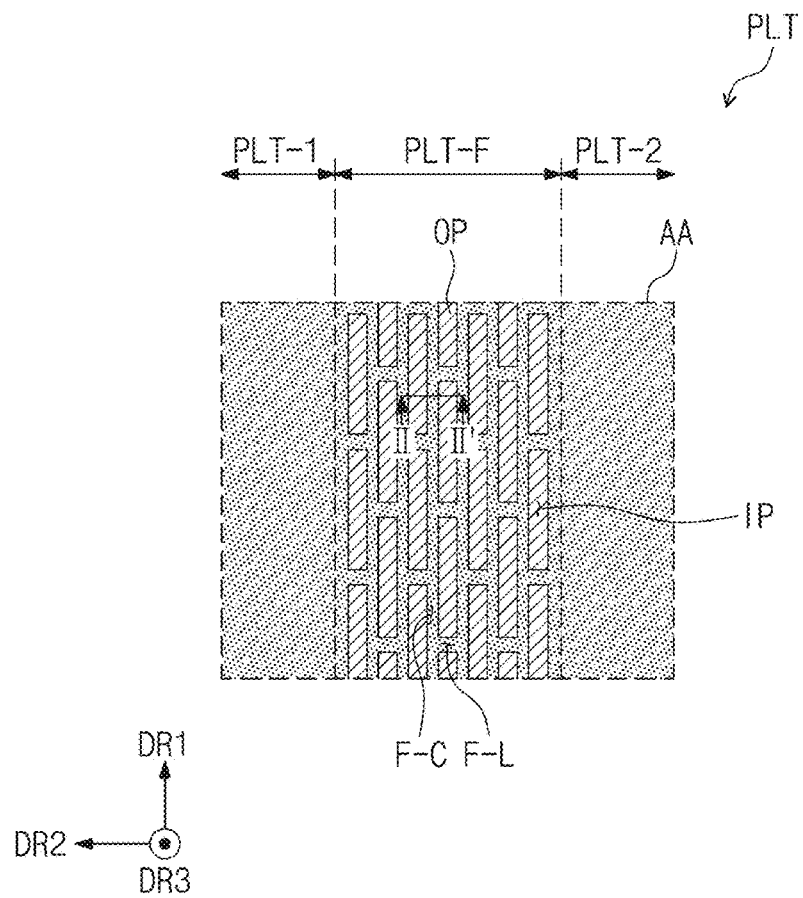
FIG. 11A is an enlarged plan view of a portion of a support plate according to an embodiment of the present disclosure.
Figure 11B:
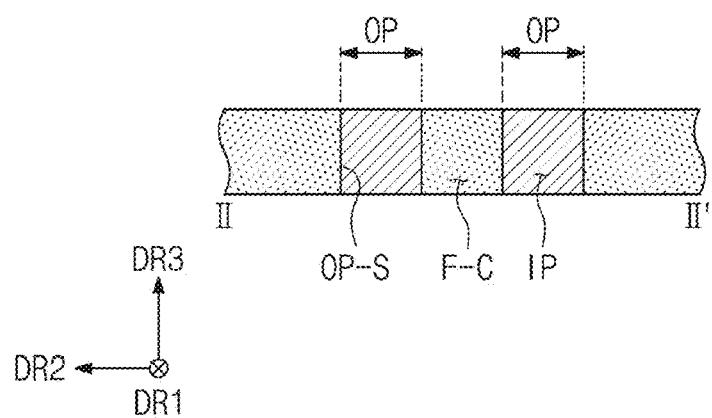
FIGS. 11B to 11E are cross-sectional views corresponding to the line II-II' of FIG. 11A.
Figure 11C:
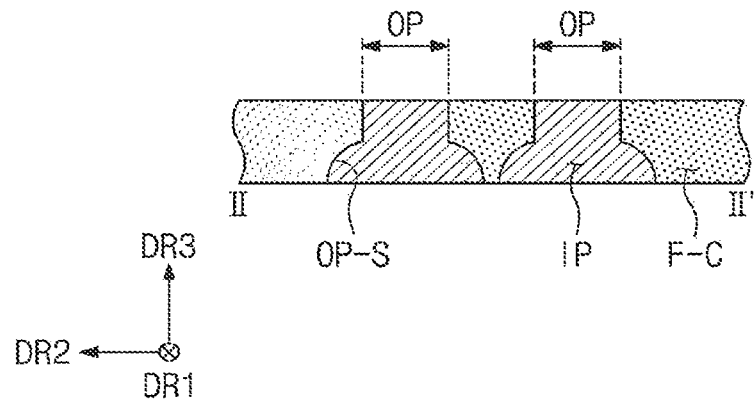
Figure 11D:
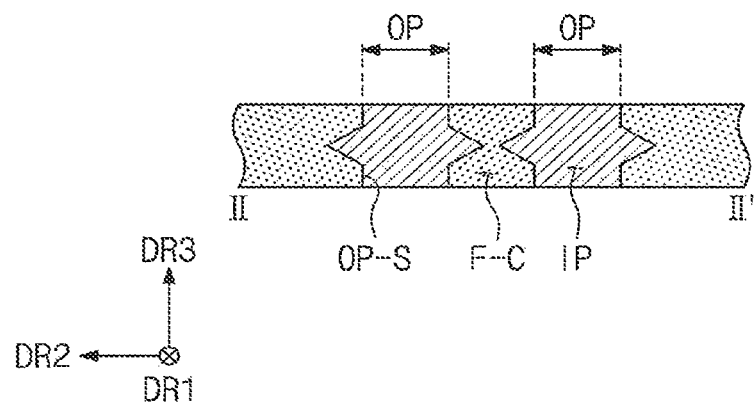
Figure 11E:
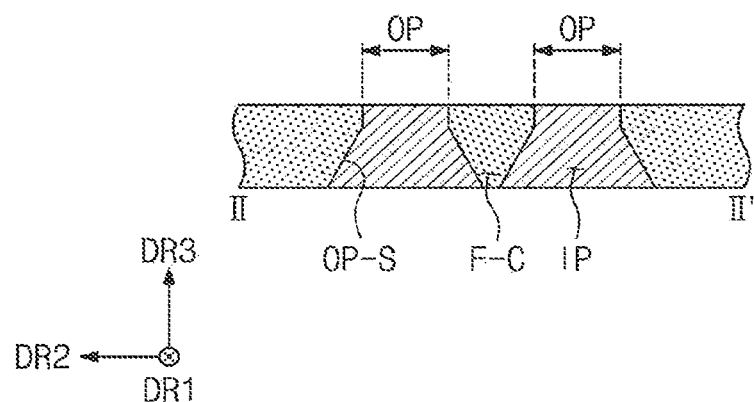

FIG. 11A is an enlarged plan view of a portion of a support plate PLT according to an embodiment of the present disclosure. FIGS. 11B through 11E are cross-sectional views corresponding to the line II-II' of FIG. 11A. FIGS. 12A through 12E are cross-sectional views of the support plate PLT according to one or more embodiments of the present disclosure.

Referring to FIG. 11A, a reinforcement member IP having a lower elastic modulus than that of the support plate PLT may be disposed in the openings OP of the support plate PLT. The disposition of the reinforcement member IP may improve the impact resistance of the second partial area P2 (e.g., see FIG. 7B) overlapping with the openings OP. The reinforcement member IP may include any one of silicon, rubber, or a synthetic resin.

As shown in FIGS. 11B through 11E, the reinforcement member IP may completely fill the openings OP. Top and bottom surfaces of the reinforcement member IP may be parallel to or substantially parallel to the top and bottom surfaces, respectively, of the support plate PLT.

As shown in FIGS. 11B through 11E, an inner surface OP-S defining the opening OP may have various suitable shapes. However, the shape of a cross section of the inner surface OP-S is not particularly limited.

Referring to FIGS. 12A through 12E, the reinforcement member IP may include a first reinforcement member IP1 having a first elastic modulus, and a second reinforcement member IP2 having a second elastic modulus.

The first reinforcement member IP1 may have a low elastic modulus, and may be disposed more upper (e.g., in a direction adjacent to the display module DM (e.g., see FIG. 5A)) than the second reinforcement member IP2 having a high second elastic modulus, or vice versa.

Figure 12A:
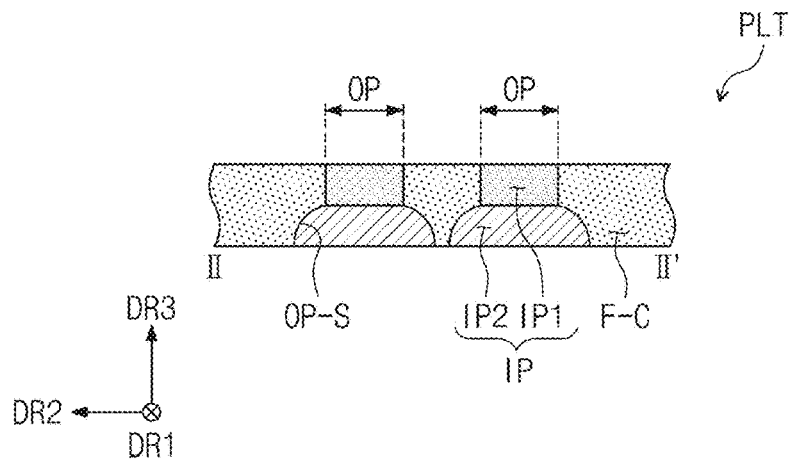
FIGS. 12A to 12E are cross-sectional views of a support plate according to one or more embodiments of the present disclosure.
Figure 12B:
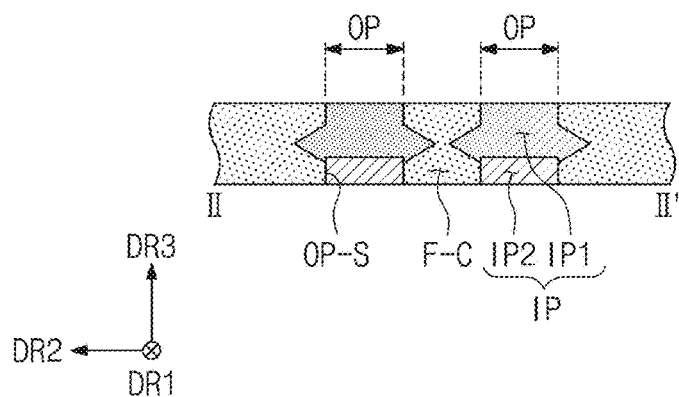
Figure 12C:
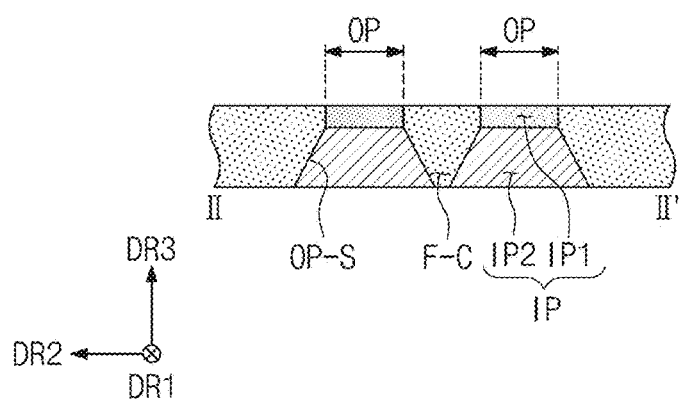
Figure 12D:
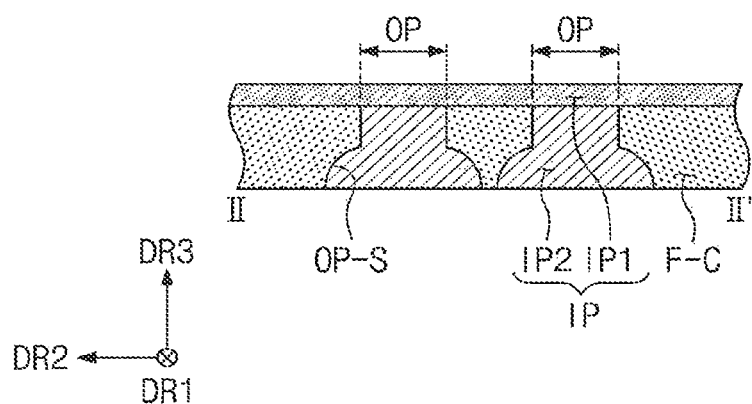
Figure 12E:
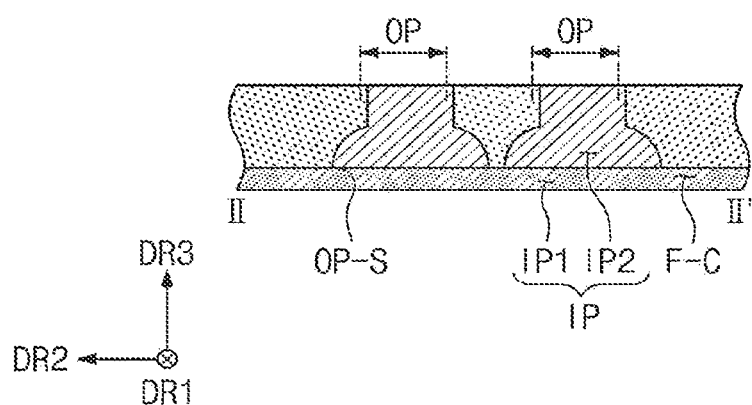

Referring to FIG. 12D, the first reinforcement member IP1 may be disposed on the top surface of the support plate PLT, and the second reinforcement member IP2 may be disposed at (e.g., in or on) the openings OP. Referring to FIG. 12E, the first reinforcement member IP1 may be disposed on the bottom surface of the support plate PLT, and the second reinforcement member IP2 may be disposed at (e.g., in or on) the openings OP. The positions of the first reinforcement member IP1 and the second reinforcement member IP2 may be exchanged with each other.

Figure 13A:
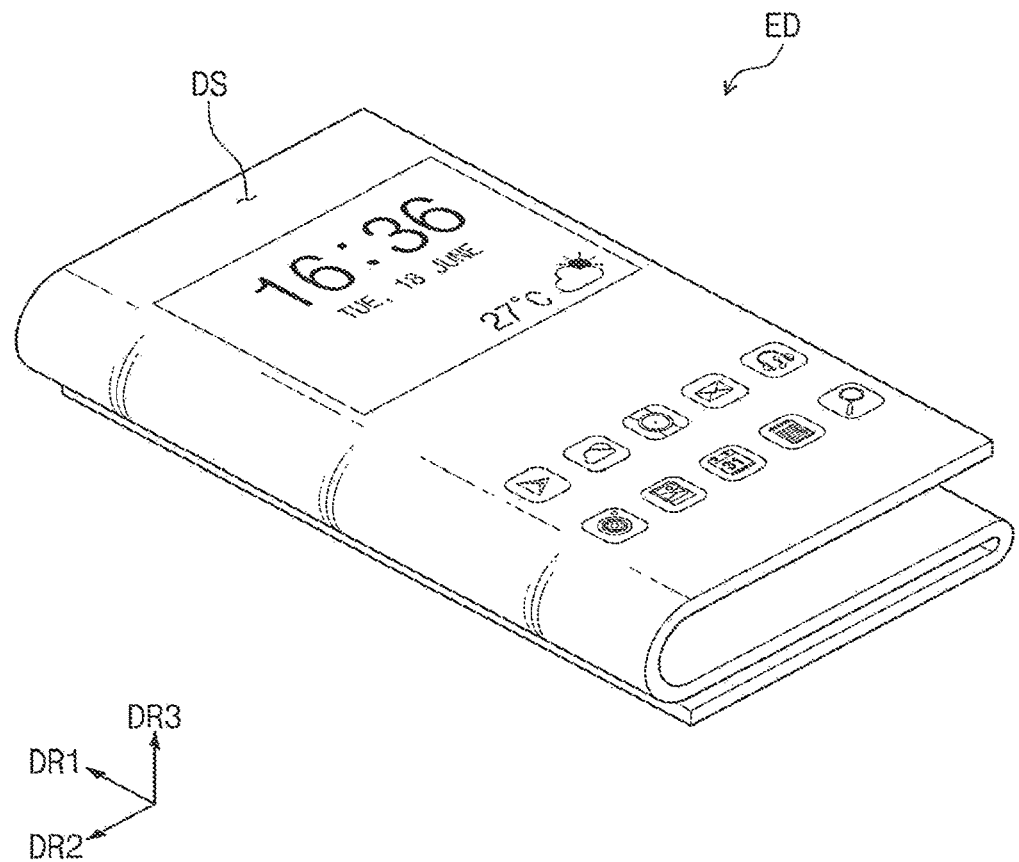
FIGS. 13A to 13C are perspective views of an electronic device according to an embodiment of the present disclosure.
Figure 13B:
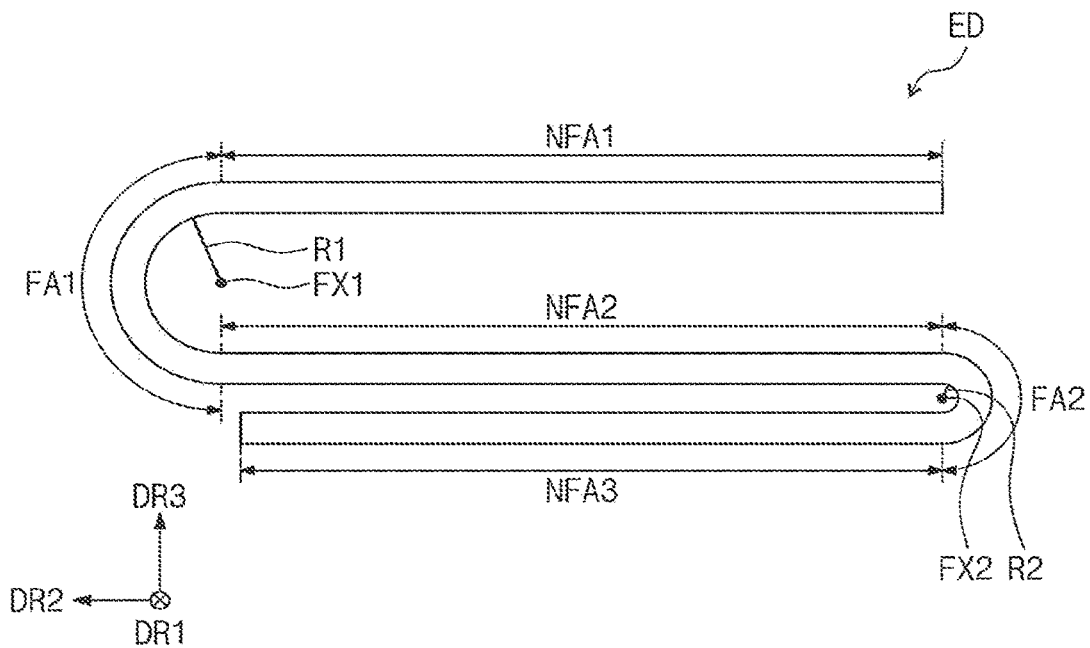
Figure 13C:
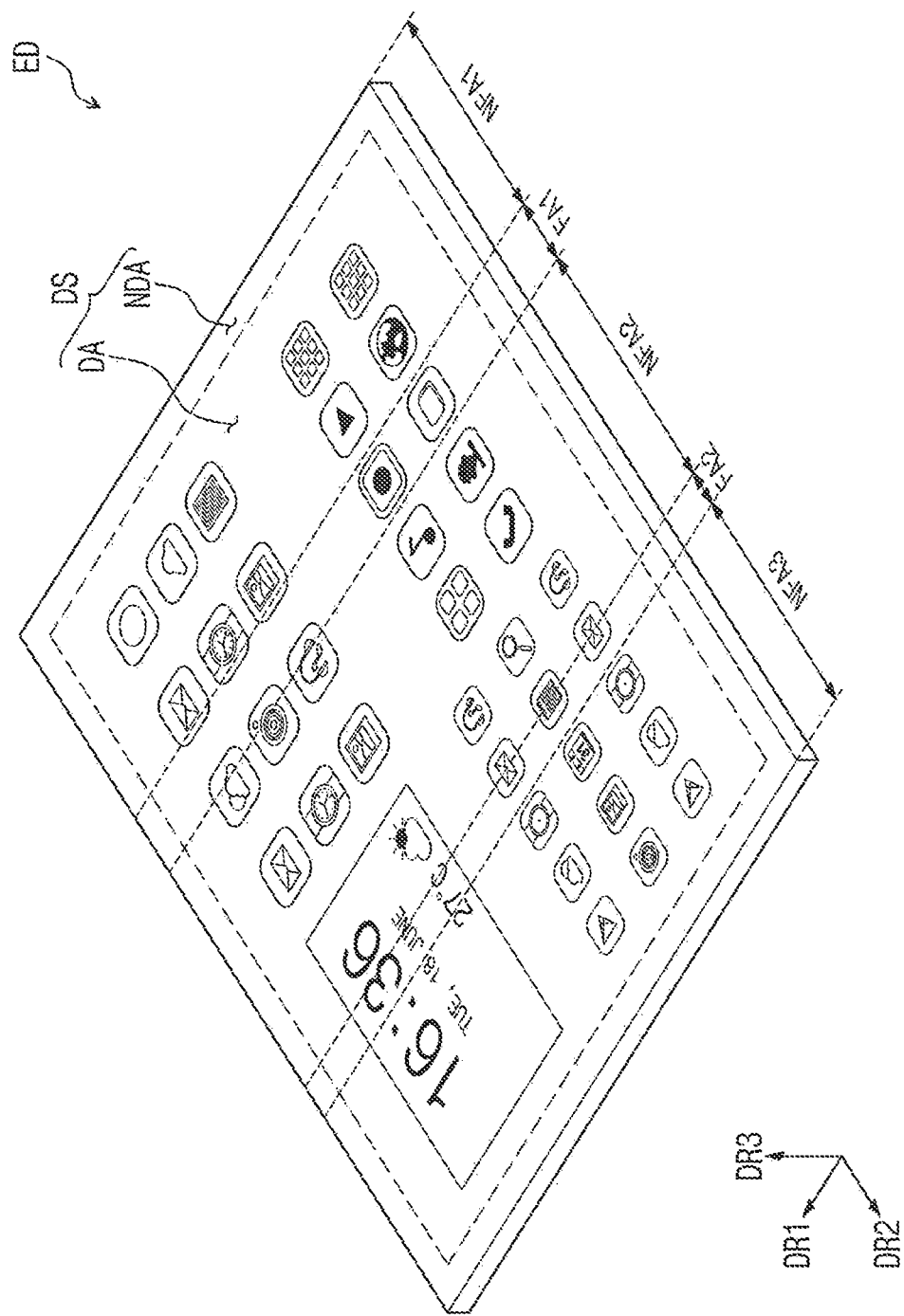

FIGS. 13A through 13C are perspective views of an electronic device ED according to an embodiment of the present disclosure.

Referring to FIGS. 13A through 13C, the electronic device ED according to an embodiment of the present disclosure may have a rectangular shape (e.g., in an unfolded state), in which the long sides lie (e.g., extend) in the first direction DR1 and the short sides lie (e.g., extend) in the second direction that crosses the first direction DR1. However, the present disclosure is not limited thereto, and the electronic device ED may have various suitable shapes, such as a circular shape or another polygonal shape.

The electronic device ED may include a plurality of folding areas FA1 and FA2, and a plurality of non-folding areas NFA1, NFA2, and NFA3. In the present embodiment, an example of the electronic device ED including the first folding area FA1, the second folding area FA2, the first non-folding area NFA1, the second non-folding area NFA2, and the third non-folding area NFA2 is illustrated. The first folding area FA1 is disposed between the first non-folding area NFA1 and the second non-folding area NFA2 in the second direction DR2, and the first folding area FA2 is disposed between the second non-folding area NFA2 and the third non-folding area NFA3 in the second direction DR2. While the two folding areas FA1 and FA2 and the three non-folding areas NFA1, NFA2 and NFA3 are illustrated as an example, the number of the folding areas FA1 and FA2 and the non-folding areas NFA1, NFA2 and NFA3 are not limited thereto, and may be suitably increased as needed or desired.

Referring to FIGS. 13A and 13B, the first folding area FA1 may be folded on the basis of a first folding axis FX1 parallel to or substantially parallel to the first direction DR1. The first folding area FA1 has a suitable curvature (e.g., a predetermined or prescribed curvature), and a first radius R1 of the curvature. A display surface of the first non-folding area NFA1 is disposed towards the outside, and a display surface of the second non-folding area NFA2 may be outer-folded, so as to be distant away from the display surface of the first non-folding area NFA1. The second folding area FA2 may be folded on the basis of a second folding axis FX2 parallel to or substantially parallel to the first direction DR1. The second folding area FA2 has a suitable curvature (e.g., a predetermined or prescribed curvature), and a second radius R2 of the curvature. The second folding area FA2 may be inner-folded, so that the display surface of the second non-folding area NFA2 is close to and faces a display surface of the third non-folding area NFA3.

The first radius R1 of curvature of the outer-folded first folding area FA1 may be larger than the second radius R2 of curvature of the inner-folded second folding area FA2. According to the first radius R1 of curvature and the second radius R2 of curvature, the width of the first folding area FA1 in the second direction DR2 and the width of the second folding area FA2 in the second direction DR2 may be determined. Accordingly, the width of the first folding area FA1 in the second direction DR2 may be larger than the width of the second folding area FA2 in the second direction DR2.

Referring to FIGS. 13A and 13B, the first folding area FA1 and the second folding area FA2 may correspond to the folding area FA described above with reference to FIGS. 1A through 1C.

Figure 14A:
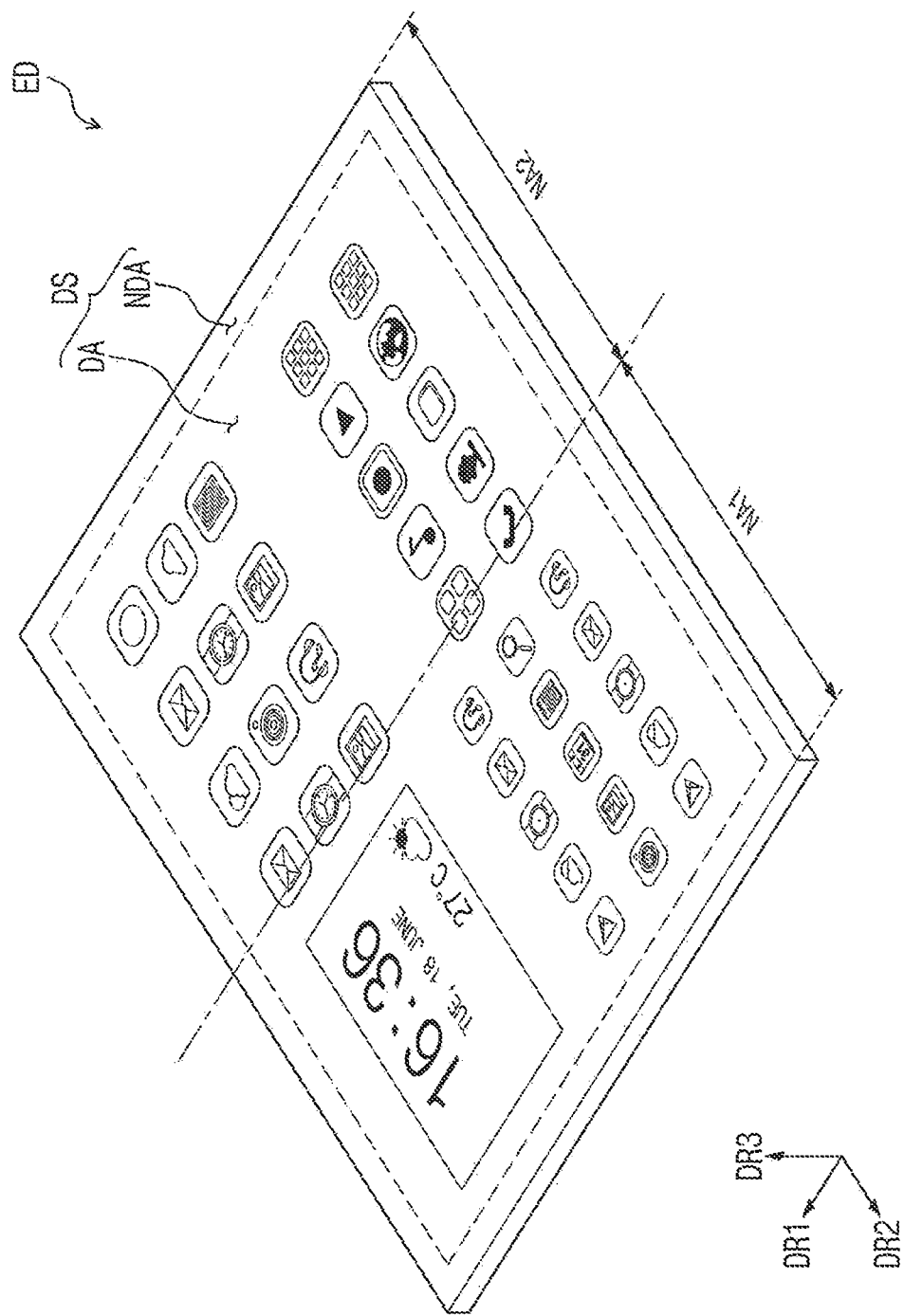
FIGS. 14A to 14C are perspective views of an electronic device according to an embodiment of the present disclosure.
Figure 14B:
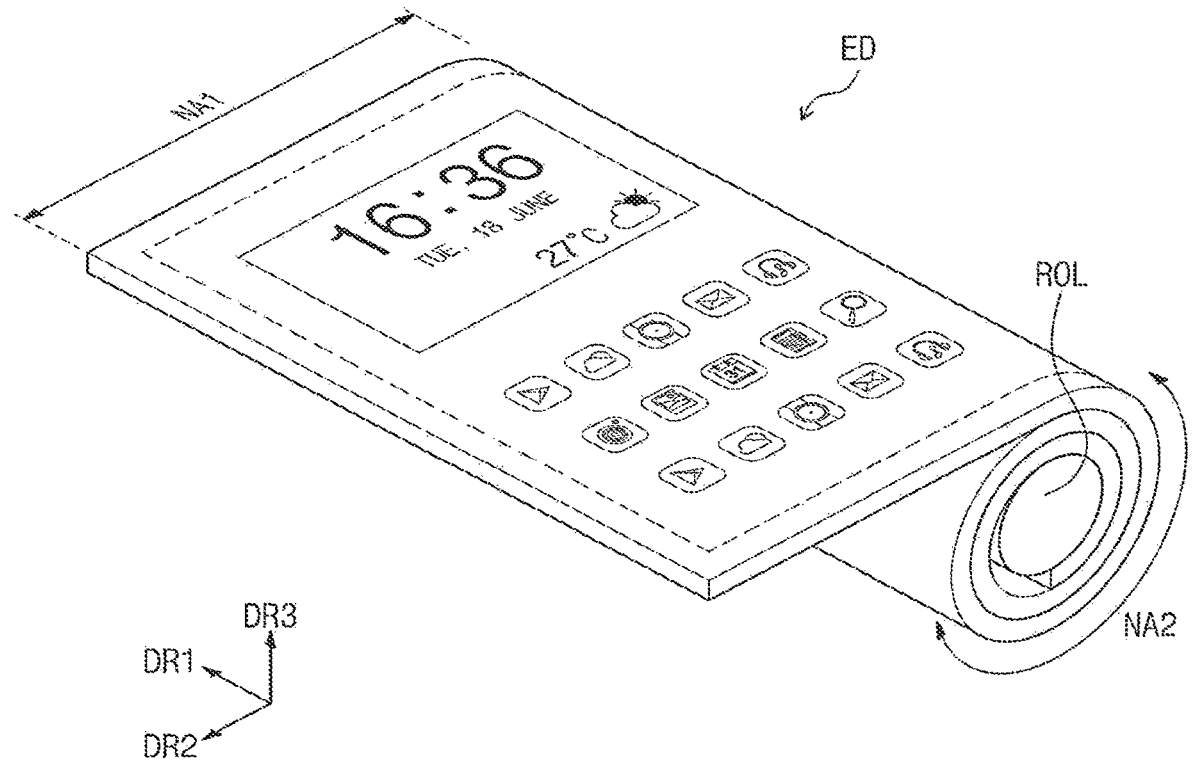
Figure 14C:
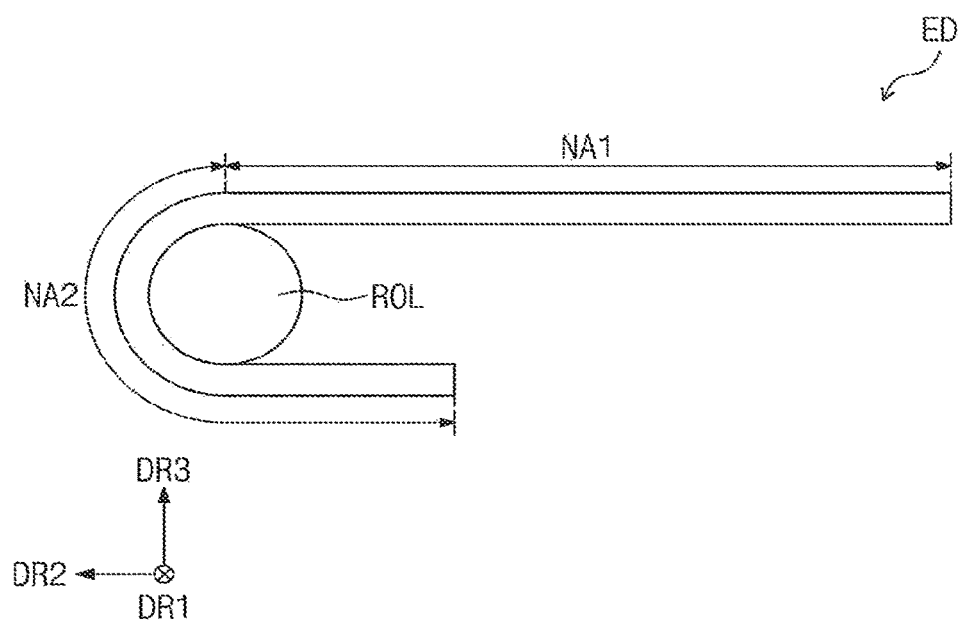

FIGS. 14A through 14C are perspective views of an electronic device ED according to an embodiment of the present disclosure.

Referring to FIGS. 14A and 14B, the electronic device ED according to an embodiment of the present disclosure may include a rollable display device. In FIGS. 14A and 14B, a housing accommodating a roller ROL, and a rolled part are not shown. The electronic device ED may include a first part NA1 that maintains or substantially maintains an unfolded state regardless of the operations, and a second part NA2 that may be rolled according to a change from a first mode to a second mode. The second part NA2 may have a flat or substantially flat shape in the first mode, and the second part NA2 may have a bent (or rolled) shape in the second mode. The configuration of the folding area FA described above with reference to FIGS. 3 and 5A to 10 may be applied to the second part NA2 in the same or substantially the same manner.

Referring to FIG. 14C, the electronic device ED according to an embodiment of the present disclosure may include a slidable display device. In FIG. 14C, the housing accommodating the roller ROL is not shown.

The electronic device ED may include a first part NA1 that maintains or substantially maintains an unfolded state regardless of the operations, and a second part NA2 that may be slid according to a change from a first mode to a second mode. The second part NA2 may have a flat or substantially flat shape in the first mode, and the second part NA2 may have a bent shape in the second mode. The configuration of the folding area FA described above with reference to FIGS. 3 and 5A to 10 may be applied to the second part NA2 in the same or substantially the same manner.

FIG. 14C illustrates a type in which the second part NA2 is inserted into the housing. The electronic device ED in an embodiment of the present disclosure may be slid in a plurality of areas. The electronic device ED may include a third part facing the second part NA2 with the first part NA1 interposed therebetween. The third part may also be slid to be inserted into the housing according to the change from the first mode to the second mode.

According to one or more embodiments of the present disclosure, a pixel circuit may not be disposed at (e.g., in or on) an area corresponding to an opening in a support plate of a display panel, or the resolution of a disposed pixel circuit is low. Accordingly, a fault of disconnection or short circuit in the pixel circuit due to an external impact may be reduced.

Stress generated in a folding area or rolling area of the support plate by the opening in the support plate may be reduced. A reinforcement member disposed in the opening in the support plate may improve impact resistance characteristics of a partial area of the display panel corresponding to the opening of the support plate.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a support plate comprising:
      a first area; and
      a second area comprising a plurality of openings, and a support area adjacent to the plurality of openings; and
   a display panel comprising a first display area overlapping with the first area, and a second display area overlapping with the second area,
   wherein the second display area comprises:
      a first partial area overlapping with at least a portion of the support area, and comprising a first pixel circuit, a second pixel circuit, and a first light emitting element electrically connected with the first pixel circuit; and
      a plurality of second partial areas overlapping with the plurality of openings, respectively, and comprising a second light emitting element electrically connected to the second pixel circuit.

2. The display device of claim 1, wherein the first area has a planar support surface.

3. The display device of claim 1, wherein the first display area and the second display area satisfy $W1/Z \geq (W1+W2)/H$, wherein:
   W1 denotes a width of the first partial area in a first direction, and W2 denotes a width of a second partial area from among the plurality of second partial areas in the first direction;
   H denotes a standard width of a pixel circuit of the first display area calculated on a basis of a resolution of pixel circuits in the first display area; and
   Z denotes a standard width of the first pixel circuit calculated on a basis of a resolution of pixel circuits in the first partial area.

4. The display device of claim 3, wherein an actual measurement width of pixel circuit of the second display area is smaller than the standard width of the pixel circuit of the first display area.

5. The display device of claim 1, wherein the first display area comprises a third pixel circuit, and a third light emitting element electrically connected to the third pixel circuit.

6. The display device of claim 5, wherein an area of the third pixel circuit in a plan view is the same as an area of the first pixel circuit in a plan view and an area of the second pixel circuit in a plan view.

7. The display device of claim 5, wherein the first display area further comprises a fourth pixel circuit, and
   wherein at least one of the plurality of second partial areas further comprises a fourth light emitting element electrically connected to the fourth pixel circuit.

8. The display device of claim 7, wherein the display panel further comprises a connection line connecting the fourth pixel circuit and the fourth light emitting element to each other, and
   wherein the connection line is located at a different layer from a layer at which an anode of the fourth light emitting element is located.

9. The display device of claim 7, wherein the first display area and the second display area satisfy $W1/Z < (W1+W2)/H$, wherein:
   W1 denotes a width of the first partial area in a first direction, and W2 denotes a width of a second partial area from among the plurality of second partial areas in the first direction;
   H denotes a standard width of a pixel circuit of the first display area calculated on a basis of a resolution of pixel circuits in the first display area; and
   Z denotes a standard width of the first pixel circuit calculated on a basis of a resolution of pixel circuits in the first partial area.

10. The display device of claim 5, wherein a resolution of light emitting elements in the first display area is the same as a resolution of light emitting elements in the second display area.

11. The display device of claim 10, wherein a resolution of pixel circuits in the first partial area of the second display area is higher than a resolution of pixel circuits in the first display area.

12. The display device of claim 10, wherein a resolution of pixel circuits in the first display area is higher than a resolution of pixel circuits in a second partial area from among the plurality of second partial areas of the second display area.

13. The display device of claim 12, wherein a pixel circuit is not disposed in the second partial area from among the plurality of second partial areas.

14. The display device of claim 12, wherein the second partial area further comprises a fourth pixel circuit, and a fourth light emitting element connected to the fourth pixel circuit.

15. The display device of claim 14, wherein a width of the second partial area is larger than a width of the first partial area in a first direction.

16. The display device of claim 1, wherein each of the second area and the second display area have a flat shape in a first mode, and each of the second area and the second display area have a bent shape in a second mode.

17. The display device of claim 1, wherein the first area comprises a plurality of first areas, and the second area comprises a plurality of second areas, and
   wherein each of the plurality of second areas is located between two adjacent first areas among the plurality of first areas.

18. The display device of claim 1, further comprising:
   a reinforcement member having a lower elastic modulus than that of the support plate,
   wherein the reinforcement member is located inside the plurality of openings.

19. The display device of claim 18, wherein the reinforcement member comprises any one of silicone, rubber, or a synthetic resin.

20. The display device of claim 18, wherein the reinforcement member comprises a first reinforcement member having a first elastic modulus, and a second reinforcement member having a second elastic modulus.

21. The display device of claim 20, wherein the first reinforcement member and the second reinforcement member contact an inside of the plurality of openings.

22. The display device of claim 20, wherein any one of the first reinforcement member or the second reinforcement member covers one surface of the support plate.

23. The display device of claim 1, wherein the support plate comprises a metal.

24. The display device of claim 1, wherein the support area of the support plate comprises:
   a plurality of first extension parts arrayed along a first direction, and extending in a second direction that crosses the first direction; and a plurality of second extension parts located between adjacent first extension parts from among the plurality of first extension parts, and extending in the first direction.

25. The display device of claim 24, wherein the first extension parts and the second extension parts define a lattice structure.

26. The display device of claim 1, wherein the support area of the support plate comprises a plurality of stick members arrayed along a first direction, and extending in a second direction that crosses the first direction, and wherein the plurality of openings are located between the plurality of stick members.

27. A display device comprising:
a display area comprising:
 a first area; and
 a second area having a shape that changes according to a change of an operation mode,
wherein the second area comprises:
 a first partial area comprising a first pixel circuit, a first light emitting element electrically connected to the first pixel circuit and overlapping with the first pixel circuit, and a second pixel circuit; and
 a second partial area comprising a second light emitting element electrically connected to the second pixel circuit, and not overlapping with the second pixel circuit.

* * * * *